United States Patent
Miao et al.

(10) Patent No.: US 10,833,073 B2
(45) Date of Patent: Nov. 10, 2020

(54) VERTICAL TRANSISTORS WITH DIFFERENT GATE LENGTHS

(71) Applicant: International Business Machines Corporation, Armonk, NY (US)

(72) Inventors: Xin Miao, Slingerlands, NY (US); Chen Zhang, Guilderland, NY (US); Kangguo Cheng, Schenectady, NY (US); Juntao Li, Cohoes, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/584,803

(22) Filed: Sep. 26, 2019

(65) Prior Publication Data

US 2020/0043915 A1 Feb. 6, 2020

Related U.S. Application Data

(62) Division of application No. 15/812,843, filed on Nov. 14, 2017, now Pat. No. 10,580,770.

(51) Int. Cl.
*H01L 27/088* (2006.01)
*H01L 21/8234* (2006.01)
(Continued)

(52) U.S. Cl.
CPC .... *H01L 27/088* (2013.01); *H01L 21/823418* (2013.01); *H01L 21/823456* (2013.01); *H01L 21/823475* (2013.01); *H01L 21/823487* (2013.01); *H01L 23/5226* (2013.01); *H01L 29/0847* (2013.01); *H01L 29/66666* (2013.01);
(Continued)

(58) Field of Classification Search
CPC ........... H01L 27/088; H01L 21/823418; H01L 21/823456; H01L 21/823475; H01L 23/5226; H01L 29/41741; H01L 29/42376; H01L 29/7827; H01L 27/1128;
(Continued)

(56) References Cited

U.S. PATENT DOCUMENTS

| | | | |
|---|---|---|---|
| 6,846,709 | B1 | 1/2005 | Lojek |
| 7,683,428 | B2 | 3/2010 | Chidambarrao et al. |
| 8,099,686 | B2 | 1/2012 | Schultz |
| 8,637,849 | B2 | 1/2014 | Deligianni et al. |
| 9,093,379 | B2 | 7/2015 | Guillorn et al. |

(Continued)

OTHER PUBLICATIONS

List of IBM Patents or Applications Treated as Related (2 pages).

*Primary Examiner* — Shahed Ahmed
(74) *Attorney, Agent, or Firm* — Randall Bluestone; Michael J. Chang, LLC

(57) ABSTRACT

Techniques for forming VFETs with differing gate lengths are provided. In one aspect, a method for forming a VFET device includes: patterning fins in a substrate, wherein at least one of the fins includes a vertical fin channel of a FET1 and at least another one of the fins includes a vertical fin channel of a FET2; forming a bottom source and drain; forming bottom spacers on the bottom source and drain; forming gates surrounding the vertical fin channel of the FET1 and FET2; forming top spacers on the gate; and forming top source and drains at the tops of the fins by varying a positioning of the top source and drains relative to at least one of the vertical fin channel of the FET1 and the FET2 such that the FET1/FET2 have an effective gate length Lgate1/Lgate2, wherein Lgate1>Lgate2. A VFET device is also provided.

18 Claims, 15 Drawing Sheets

(51) Int. Cl.
  *H01L 23/522* (2006.01)
  *H01L 29/78* (2006.01)
  *H01L 29/66* (2006.01)
  *H01L 29/08* (2006.01)
  *H01L 29/786* (2006.01)
  *H01L 29/417* (2006.01)
  *H01L 29/423* (2006.01)
  *H01L 29/165* (2006.01)

(52) U.S. Cl.
  CPC .... *H01L 29/7827* (2013.01); *H01L 29/78642* (2013.01); *H01L 29/165* (2013.01); *H01L 29/41741* (2013.01); *H01L 29/42376* (2013.01)

(58) Field of Classification Search
  CPC .......... H01L 27/2454; H01L 21/82285; H01L 21/823487; H01L 21/823885
  See application file for complete search history.

(56) References Cited

U.S. PATENT DOCUMENTS

| | | |
|---|---|---|
| 9,287,362 B1 | 3/2016 | Basu et al. |
| 9,530,700 B1 | 12/2016 | Mallela et al. |
| 9,653,458 B1 | 5/2017 | Cheng et al. |
| 9,735,042 B2 | 8/2017 | Hung et al. |
| 9,755,073 B1* | 9/2017 | Cheng ................ H01L 29/7843 |
| 9,935,018 B1 | 4/2018 | Xie et al. |
| 2009/0321834 A1 | 12/2009 | Rachmady et al. |
| 2014/0001572 A1 | 1/2014 | Bohr et al. |
| 2016/0211369 A1 | 7/2016 | Jan et al. |
| 2017/0054027 A1 | 2/2017 | Liu |
| 2017/0125413 A1* | 5/2017 | Wu ..................... H01L 29/0649 |
| 2017/0178970 A1 | 6/2017 | Anderson et al. |
| 2017/0213821 A1* | 7/2017 | Or-Bach ............... H01L 27/092 |
| 2018/0076093 A1* | 3/2018 | Balakrishnan ........ H01L 27/088 |
| 2018/0240715 A1* | 8/2018 | Xie .................. H01L 21/82388 |

* cited by examiner

VERTICAL TRANSISTORS WITH DIFFERENT GATE LENGTHS

CROSS-REFERENCE TO RELATED APPLICATIONS

This application is a divisional of U.S. application Ser. No. 15/812,843 filed on Nov. 14, 2017, now U.S. Pat. No. 10,580,770, the contents of which are incorporated by reference herein.

FIELD OF THE INVENTION

The present invention relates to vertical field effect transistors (VFETs), and more particularly, to techniques for forming VFETs with differing gate lengths on the same chip.

BACKGROUND OF THE INVENTION

As opposed to planar complementary metal-oxide-semiconductor (CMOS) devices, vertical field effect transistors (VFETs) are oriented with a vertical fin channel disposed on a bottom source/drain and a top source/drain disposed on the fin channel. VFETs have been pursued as a potential device option for scaling CMOS to the 5 nanometer (nm) node and beyond.

A reduction in chip power consumption can be realized by increasing the gate length (Lgate) of transistors (as compared to nominal transistors) along non-critical paths on the chip as this reduces off current leakage. However, it is difficult to implement FETs of differing lengths in VFET architecture due to challenges in aligning the junction with the physical gate.

Thus, techniques for effectively forming VFET devices with differing Lgate would be desirable.

SUMMARY OF THE INVENTION

The present invention provides techniques for forming vertical field effect transistors (VFETs) with differing gate lengths on the same chip. In one aspect of the invention, a method for forming a VFET device is provided. The method includes: patterning fins in a substrate using fin hardmasks, wherein at least one of the fins includes a vertical fin channel of a first FET device (FET1) and at least another one of the fins includes a vertical fin channel of a second FET device (FET2), and wherein the fins extend partway through the substrate; forming a bottom source and drain in the substrate beneath the fins; forming bottom spacers on the bottom source and drain; forming gates surrounding the vertical fin channel of the FET1 and the vertical fin channel of the FET2; forming top spacers on the gates; and forming top source and drains at the tops of the fins, wherein the step of forming the top source and drains includes varying a positioning of the top source and drains relative to at least one of the vertical fin channel of the FET1 and the vertical fin channel of the FET2 such that the FET1 has an effective gate length Lgate1 and the FET2 has an effective gate length Lgate2, and wherein Lgate1>Lgate2.

In another aspect of the invention, a VFET device is provided. The VFET device includes: fins patterned in a substrate, wherein at least one of the fins includes a vertical fin channel of a first FET device (FET1) and at least another one of the fins includes a vertical fin channel of a second FET device (FET2), and wherein the fins extend partway through the substrate; a bottom source and drain in the substrate beneath the fins; bottom spacers on the bottom source and drain; gates surrounding the vertical fin channel of the FET1 and the vertical fin channel of the FET2; top spacers on the gates; and top source and drains at the tops of the fins, wherein a positioning of the top source and drains relative to the vertical fin channel of the FET1 and the vertical fin channel of the FET2 is different such that the FET1 has an effective gate length Lgate1 and the FET2 has an effective gate length Lgate2, and wherein Lgate1>Lgate2.

A more complete understanding of the present invention, as well as further features and advantages of the present invention, will be obtained by reference to the following detailed description and drawings.

DETAILED DESCRIPTION OF PREFERRED EMBODIMENTS

Provided herein are techniques for effectively forming vertical field effect transistors (VFETs) with differing effective gate lengths (Lgate) on the same chip. Reference is made herein to 'Wimpy' VFETs, which are VFETs with an Lgate that is slightly greater than a nominal VFET transistor. For instance, the Lgate of a wimpy VFET is from about 1.5 nanometers (nm) to about 10 nm and ranges therebetween greater than the Lgate of a nominal VFET. As provided above, employing these 'wimpy' transistors along non-critical paths in the chip circuitry can reduce power consumption. Advantageously, the present techniques can be leveraged to form both types of VFET devices (i.e., wimpy and nominal VFETs) on the same chip.

In the description that follows reference will be made to two VFET designs, one having a longer gate length Lgate1, and another having a regular gate length Lgate2, i.e., Lgate1>Lgate2. As provided above, the difference between Lgate1 and Lgate2, i.e., Lgate1−Lgate2, is from about 1.5 nm to about 10 nm and ranges therebetween. Reference will also be made to effective gate length and physical gate length. The effective gate length (Lgate) is the length of the gate in between the top and bottom source and drains. Namely, each of the VFET devices described herein will have an (undoped or lightly doped) vertical fin channel in between the top and bottom source and drains. The gate surrounds the vertical fin channel. The length of the gate alongside the vertical fin channel in between the top and bottom source and drains (heavily doped) is the effective gate length (Lgate). The gates themselves can be physically longer than the distance between the top and bottom source and drains. The actual length of the gate is the physical gate length. In the examples that follow, the effective gate length (Lgate) is less than the physical gate length.

Further, the physical gate length of all of the VFET devices can be the same. However, by adjusting the positioning of the top source and drains relative to the gate, the effective gate length (Lgate) can be varied to achieve Lgate1 and Lgate2, wherein Lgate1>Lgate2. Thus, embodiments are contemplated herein where the VFET devices have the same physical gate length as one another but a different effective gate length (Lgate) from one another.

A first exemplary embodiment of the present techniques for fabricating a VFET device with different gate lengths is now described by way of reference to FIGS. 1-19. In the following example, the fabrication of one (nominal) VFET having the (shorter) gate length Lgate2 (i.e., FET2 in the following description) and one (wimpy) VFET having the (longer) gate length Lgate1 (i.e., FET1 in the following description) on the same chip will be described. However, it is to be understood that the process can be implemented in the same manner described to produce VFETs of either type in multiples and/or individually.

Figure 1:
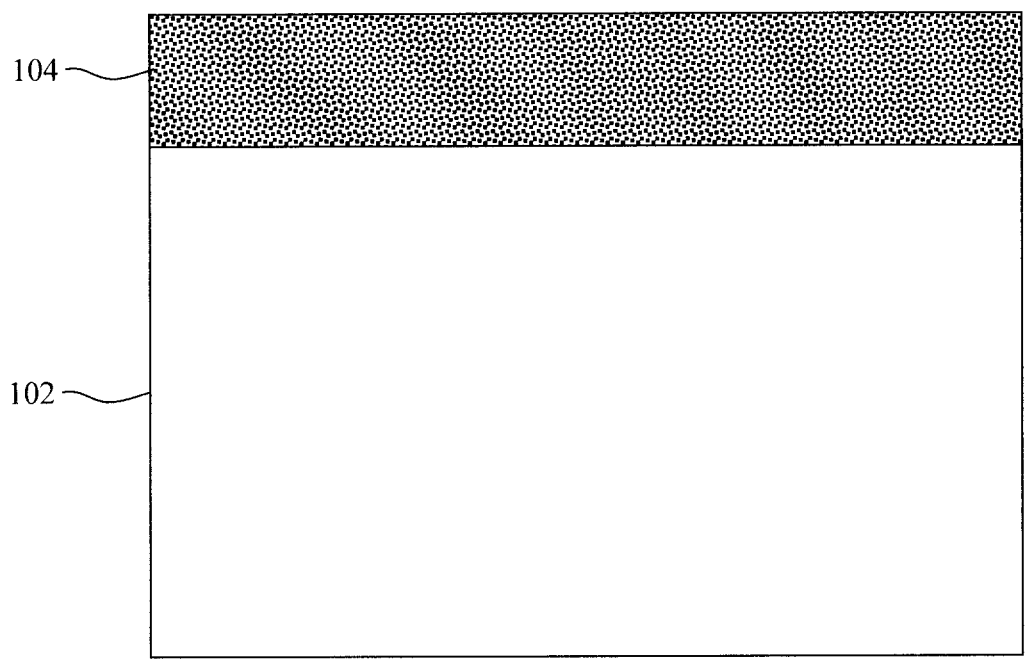
FIG. 1 is a diagram illustrating a starting structure for forming a vertical field effect transistor (VFET) device including an undoped substrate and a doped epitaxial layer having been formed on the substrate according to an embodiment of the present invention.

Referring to FIG. 1, the process begins with an undoped substrate 102. According to an exemplary embodiment, substrate 102 is a bulk semiconductor wafer, such as a bulk silicon (Si), bulk germanium (Ge), bulk silicon germanium (SiGe) and/or bulk III-V semiconductor wafer. Alternatively, substrate 102 can be a semiconductor-on-insulator (SOI) wafer. A SOI wafer includes a SOI layer separated from an underlying substrate by a buried insulator. When the buried insulator is an oxide it is referred to herein as a buried oxide or BOX. The SOI layer can include any suitable semiconductor, such as Si, Ge, SiGe, and/or a III-V semiconductor.

One or more fins will be patterned in the substrate 102. Generally, each of the VFETs formed herein will have a vertical fin channel extending up from the substrate. Top and bottom source and drains are situated in electrical contact with the top and bottom ends of the channel region, respectively. A gate is disposed on one or more of the fin sidewalls.

In this particular example, a doped epitaxial layer 104 is grown on the substrate 102 for use in forming the top source and drains. The bottom source and drains will be formed after fin patterning. However, as will be described in detail below, embodiments are anticipated herein where doped epitaxial layers for both the top and bottom source and drains are grown on the substrate 102 prior to fin patterning.

According to an exemplary embodiment, doped epitaxial layer 104 is formed from Si, Ge and/or SiGe that is in-situ (during epitaxial growth) or ex-situ (such as via ion implantation) doped with an n-type or p-type dopant. Suitable n-type dopants include, but are not limited to, phosphorous (P) and/or arsenic (As). Suitable p-type dopants include, but are not limited to, boron (B).

The next task is to pattern one or more fins in the substrate 102 and doped epitaxial layer 104. To do so, a patterned fin hardmask 202 is first formed on the doped epitaxial layer 104 marking the footprint and location of the fins. Suitable hardmask materials include, but are not limited to, nitride hardmask materials such as silicon nitride (SiN). An etch using the fin hardmasks 202 is then used to pattern fins 204 in the substrate 102 and doped epitaxial layer 104. See FIG. 2. An anisotropic etching process such as reactive ion etching (RIE) can be employed for the fin etch.

Figure 2:
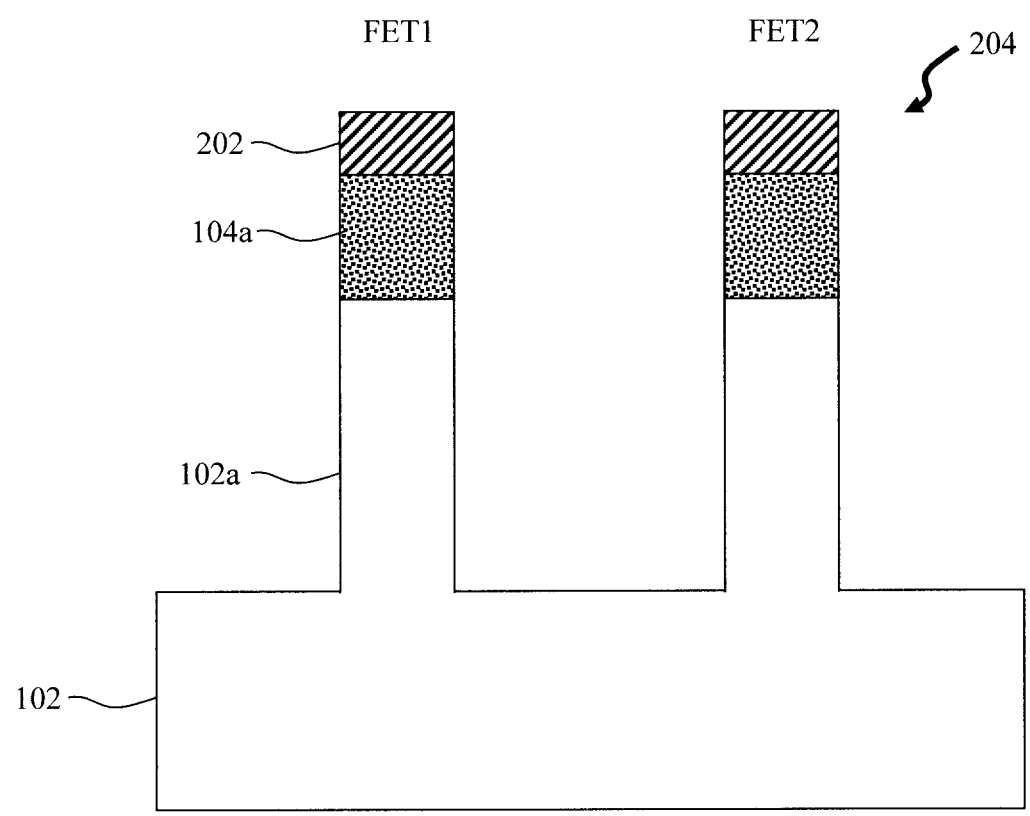
FIG. 2 is a diagram illustrating fins having been formed that extend completely through the epitaxial layer and partway into the substrate, the fins corresponding to at least one first VFET device (FET1) and at least one second VFET device (FET2) according to an embodiment of the present invention.
Figure 3:
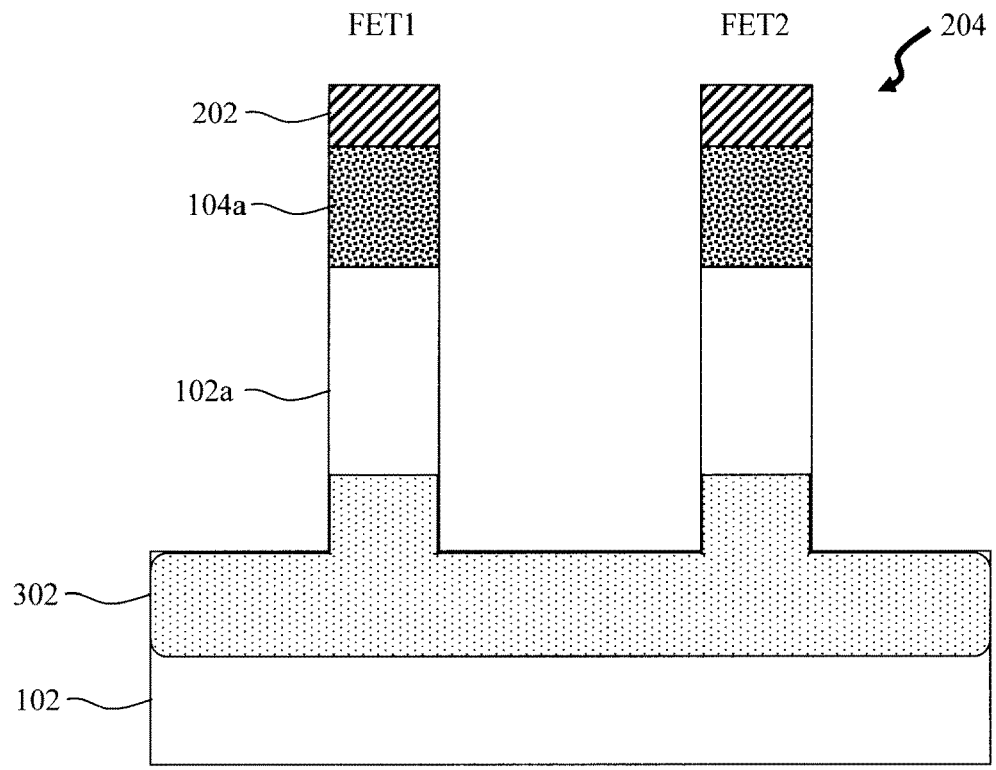
FIG. 3 is a diagram illustrating a bottom source and drain having been formed in the substrate beneath the fins according to an embodiment of the present invention.
Figure 4:
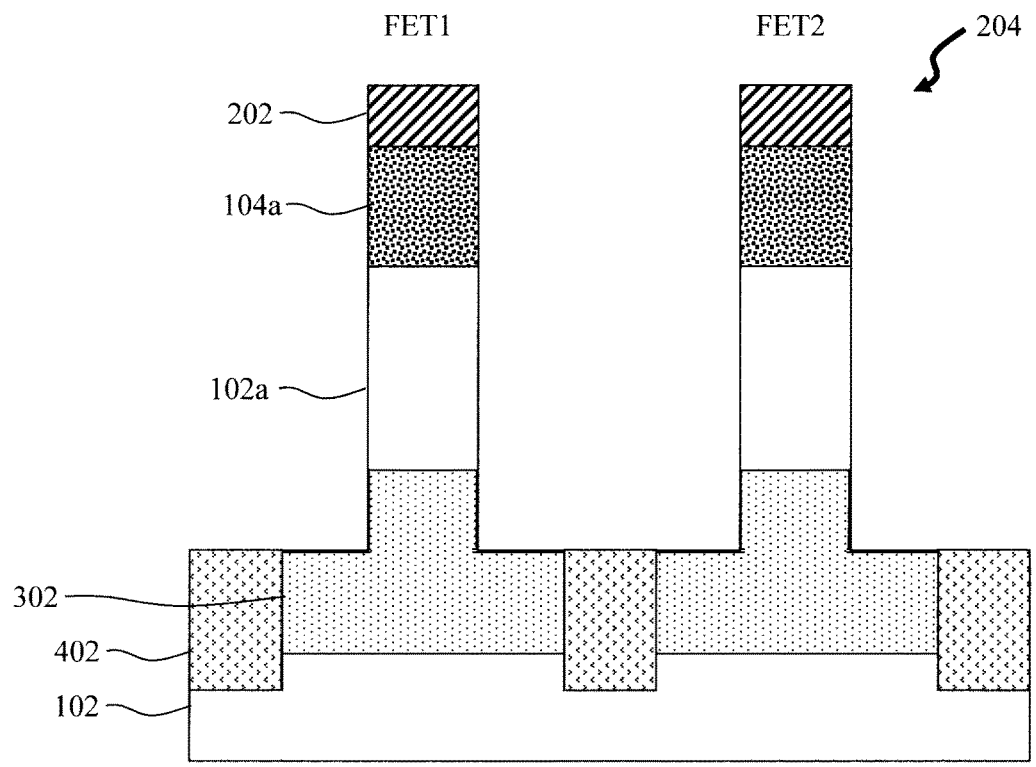
FIG. 4 is a diagram illustrating shallow trench isolation (STI) regions having been formed in the substrate in between the fins according to an embodiment of the present invention.

As shown in FIG. 2, the fin etch extends completely through the epitaxial layer 104 and partway into the substrate 102, with a portion of the substrate 102 remaining intact beneath each of the fins 204. As such, each of the fins 204 now includes a portion 102a (formed from the substrate 102) which will serve as the (undoped) vertical fin channel, and a portion 104a (formed from the doped epitaxial layer 104) which will be used to form the top source and drains.

As highlighted above, this example involves forming at least one (wimpy) VFET having the (longer) gate length Lgate1 (i.e., FET1) and at least one (nominal) VFET having the (shorter) gate length Lgate2 (i.e., FET2) on the same chip. The fins 204 that will be used in fabricating each of these devices are labeled "FET1" and "FET2," respectively.

In this particular example, a bottom source and drain 302 is now formed in the substrate 102 beneath the fins 204. See FIG. 3. According to an exemplary embodiment, the bottom source and drain 302 is formed using ion implantation. As provided above, suitable n-type dopants include phosphorous and/or arsenic, and suitable p-type dopants include, but are not limited to, boron. The (undoped) portion 102a of each of the fins 204 above the bottom source and drain 302 serves as the vertical fin channel of the respective FET (i.e., FET1 and FET2).

Ion implantation is only one of the techniques contemplated herein for forming the bottom source and drain 302. For instance, a thermally-driven diffusion of dopants from a highly-doped epitaxial material (such as phosphorous-doped epitaxial Si (Si:P) or boron-doped epitaxial SiGe (SiGe:B)) deposited between the fins (not shown) can instead be used to form the bottom source and drain 302. This technique is described, for example, in U.S. patent application Ser. No. 15/713,975 by Li et al., entitled "Vertical FET with Sharp Junctions," the contents of which are incorporated by reference as if fully set forth herein.

Shallow trench isolation (STI) regions 402 are then formed in the substrate 102 in between the fins 204. See FIG. 4. The STI regions 402 will isolate the VFET devices (i.e., FET1 and FET2) from one another. The STI regions 402 are formed by forming trenches in the substrate 102, filling the trenches with an insulator such as an STI oxide, and then recess-etching the STI oxide to the appropriate depth/thickness (e.g., using processes such as chemical-mechanical polishing (CMP) and RIE/wet etching). Suitable STI oxides include, but are not limited to, silicon dioxide ($SiO_2$).

A bottom spacer 502 is then formed on the bottom source and drain 302 and on the fin hardmasks 202. See FIG. 5. Suitable materials for the bottom spacer 502 include, but are not limited to, oxide spacer materials such as $SiO_2$ and/or silicon oxycarbide (SiOC) and/or nitride spacer materials such as SiN and/or silicon-boron-nitride (SiBN).

According to an exemplary embodiment, the bottom spacer 502 is formed using a directional deposition process whereby the spacer material is deposited onto the bottom source and drain 302, fin hardmasks 202 and fins 204 with a greater amount of the material being deposited on horizontal surfaces (including on top of the bottom source and drain 302 in between the fins 204), as compared to vertical surfaces (such as along sidewalls of the fins 204). Thus, when an etch is used on the spacer material, the timing of the etch needed to remove the spacer material from the vertical surfaces will leave the bottom spacer 502 shown in FIG. 5 on the bottom source and drain 302 and on the fin hardmasks 202 since a greater amount of the spacer material was deposited on the bottom source and drain 302. By way of example only, a high density plasma (HDP) chemical vapor deposition (CVD) or physical vapor deposition (PVD) process can be used for directional film deposition, and an oxide- or nitride-selective (depending on the spacer material) isotropic etch can be used to remove the (thinner) spacer material deposited onto the vertical surfaces.

Next, a gate (i.e., a gate dielectric and a gate conductor) is formed surrounding each of the fins 204. To form the gate, an interfacial oxide 601 (e.g., $SiO_2$ which may include other chemical elements in it such as nitrogen, germanium, etc.) is first formed selectively on exposed (e.g., Si/SiGe) surfaces of the fins 204 by an oxidation process to a thickness of from about 0.3 nm to about 5 nm, and ranges therebetween, e.g., about 1 nm. A conformal gate dielectric 602 is then deposited onto the fins 204 over the interfacial oxide 601 and over the bottom spacers 502, and a conformal gate conductor 604 is deposited onto the gate dielectric 602. See FIG. 6. According to an exemplary embodiment, a metal gate is formed wherein the gate conductor 604 is a metal or combination of metals and the gate dielectric 602 is a high-κ dielectric. For instance, the gate conductor 604 is a workfunction setting metal. The particular workfunction metal employed can vary depending on whether an n-type or p-type transistor is desired. Suitable n-type workfunction setting metals include, but are not limited to, titanium nitride (TiN), tantalum nitride (TaN) and/or aluminum (Al)-containing alloys such as titanium aluminide (TiAl), titanium aluminum nitride (TiAlN), titanium aluminum carbide (TiAlC), tantalum aluminide (TaAl), tantalum aluminum nitride (TaAlN), and/or tantalum aluminum carbide (TaAlC). Suitable p-type workfunction setting metals include, but are not limited to, TiN, TaN, and tungsten (W). TiN and TaN are relatively thick (e.g., greater than about 2 nm) when used as p-type workfunction metals. However, very thin TiN or TaN layers (e.g., less than about 2 nm) may also be used beneath Al-containing alloys in n-type workfunction stacks to improve electrical properties such as gate leakage currents. Thus, there is some overlap in the exemplary n- and p-type workfunction metals given above.

The term "high-κ" as used herein refers to a material having a relative dielectric constant κ which is much higher than that of silicon dioxide (e.g., a dielectric constant κ=25 for hafnium oxide ($HfO_2$) rather than 4 for $SiO_2$). Suitable high-κ gate dielectrics include, but are not limited to, $HfO_2$ and/or lanthanum oxide ($La_2O_3$).

The gate dielectric 602 and gate conductor 604 need to be recessed to expose the tops of the fins 204 in order to permit formation of the top source and drain regions. To do so, a directional etching of the gate dielectric 602 and gate conductor 604 is first implemented to disconnect the gate dielectric 602 and gate conductor 604 between the fins, followed by a dielectric such as an organic planarizing layer (OPL) 702 being deposited onto the gate conductor 604 and bottom spacers 502 filling in the spaces between the fins 204. See FIG. 7. Suitable OPL materials include, but are not limited to, aromatic cross-linkable polymers (such as naphthalene-based polymers). See, for example, U.S. Pat. No. 9,093,379 issued to Guillorn et al., entitled "Silicidation Blocking Process Using Optically Sensitive HSQ Resist and Organic Planarizing Layer," the contents of which are incorporated by reference as if fully set forth herein.

The OPL 702 is then recessed to below the tops of the fins 204. See FIG. 8. For instance, in the example depicted in FIG. 8 the top of the (recessed) OPL 702 is now alongside the doped epitaxial portion 104a of each fin 204. As will become apparent from the description that follows, the recessed OPL 702 will set the physical gate length of each of the VFET devices being formed. As provided above, the physical gate length is the actual length of the gate. The physical gate length is different from the effective gate length (Lgate), i.e., the length of the gate between the top and bottom source and drains.

Figure 9:
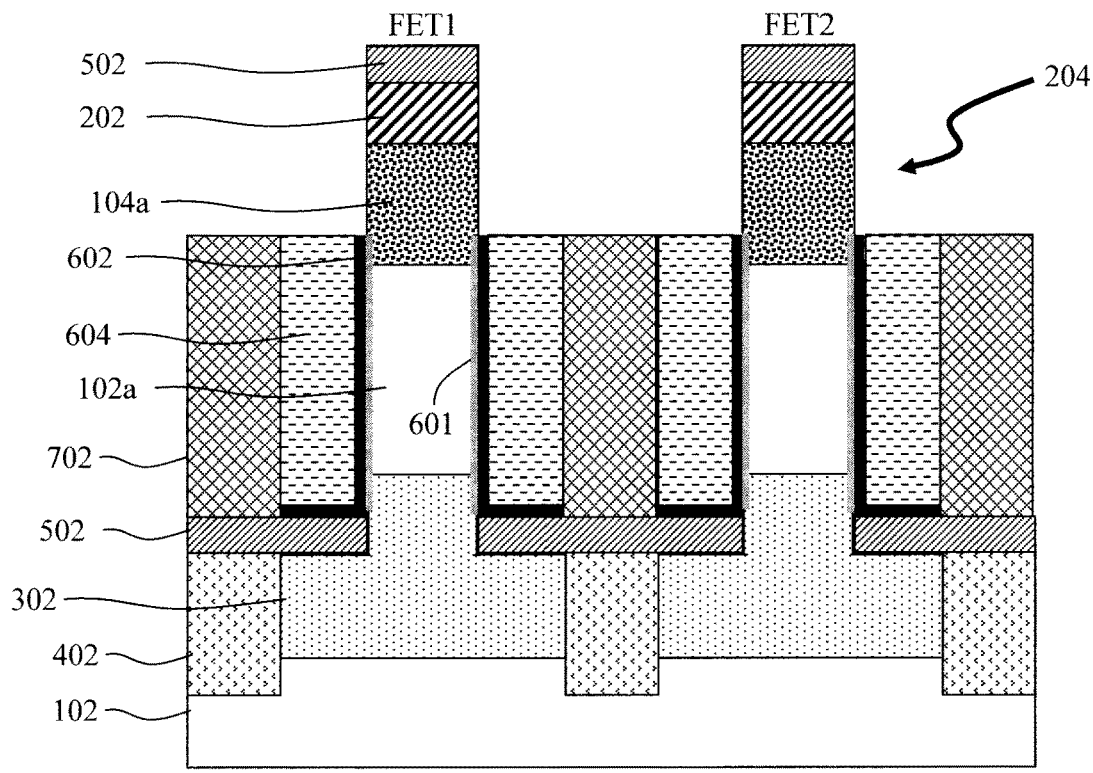
FIG. 9 is a diagram illustrating the gate dielectric and gate conductor having been recessed according to an embodiment of the present invention.
Figure 10:
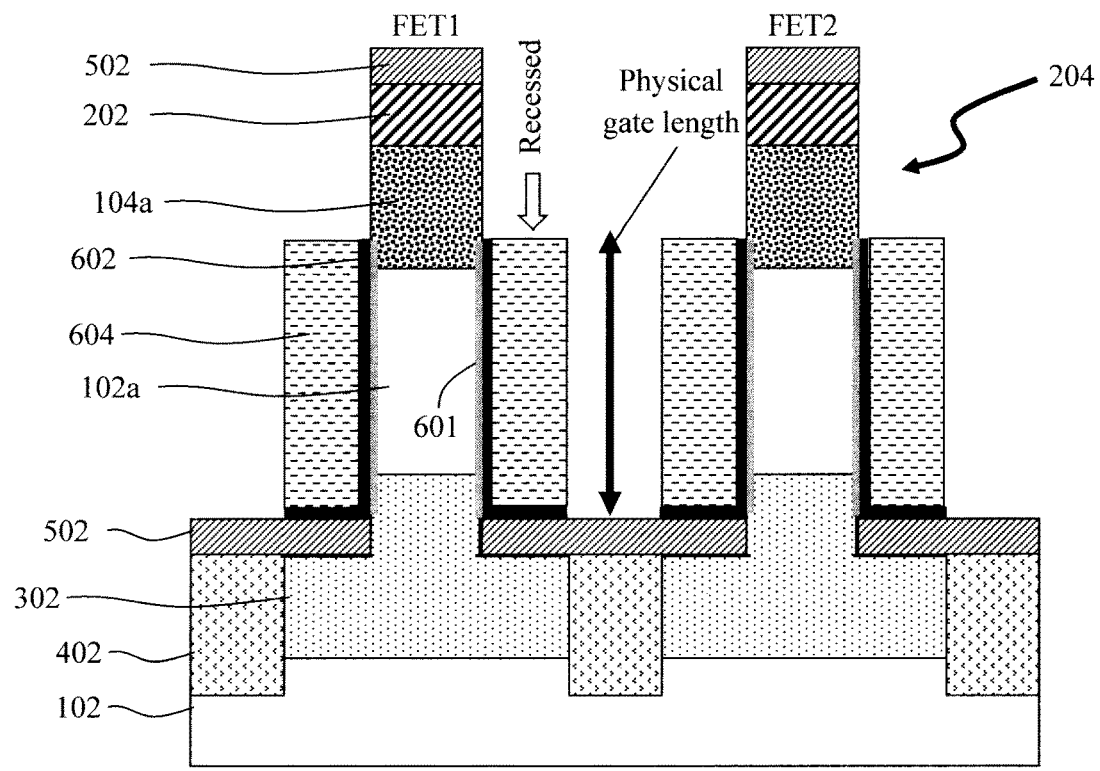
FIG. 10 is a diagram illustrating the OPL having been removed according to an embodiment of the present invention.

The gate dielectric 602 and gate conductor 604 are then also recessed. See FIG. 9. As shown in FIG. 9, the tops of the gate dielectric 602 and gate conductor 604 are now coplanar with the (recessed) top of the OPL 702. Following recess of the gate dielectric 602 and gate conductor 604, the remaining OPL 702 is removed. See FIG. 10.

As provided above, the physical gate length is established by the recess of OPL 702/gate dielectric 602 and gate conductor 604. Notably, the physical gate length of FET1 and FET2 are the same. See FIG. 10. However, as will be described in detail below, the effective gate length of the (wimpy) VFET (Lgate1 of FET1 in this example) vis-à-vis the (nominal) VFET (Lgate2 of FET2 in this example) will be varied relative to one another by adjusting the positioning of the top source and drains relative to the gate.

Figure 11:
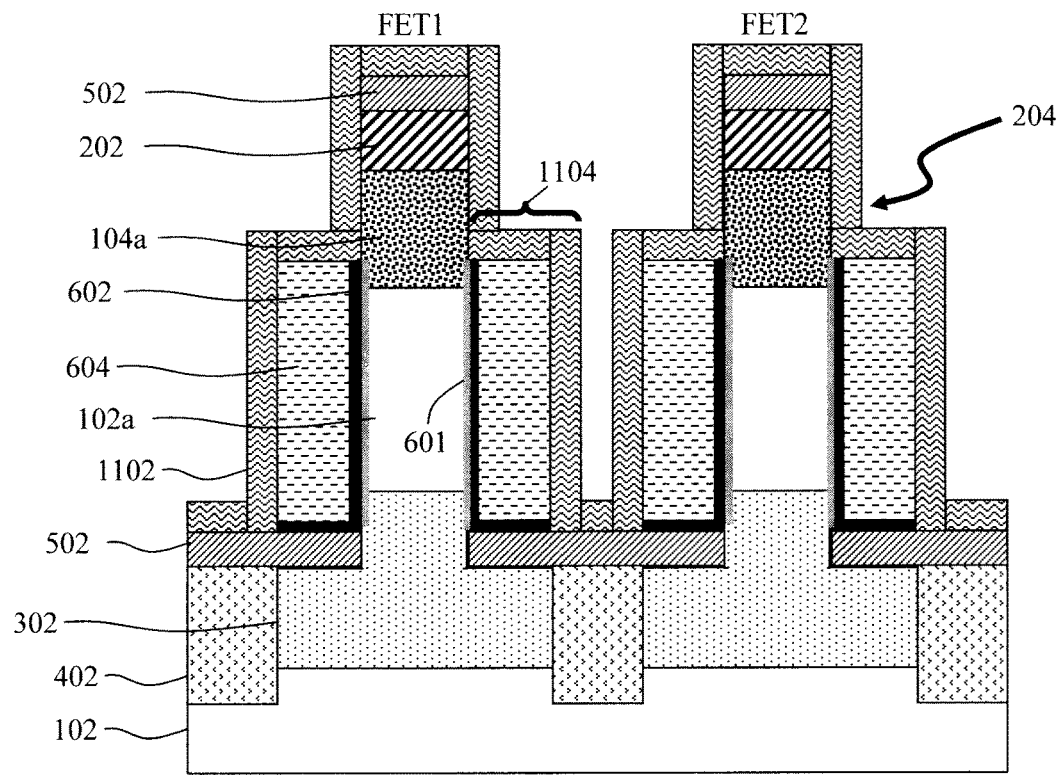
FIG. 11 is a diagram illustrating a conformal encapsulation layer having been formed on the fins and gate conductor, the encapsulation layer providing top spacers over the gate according to an embodiment of the present invention.
Figure 12:
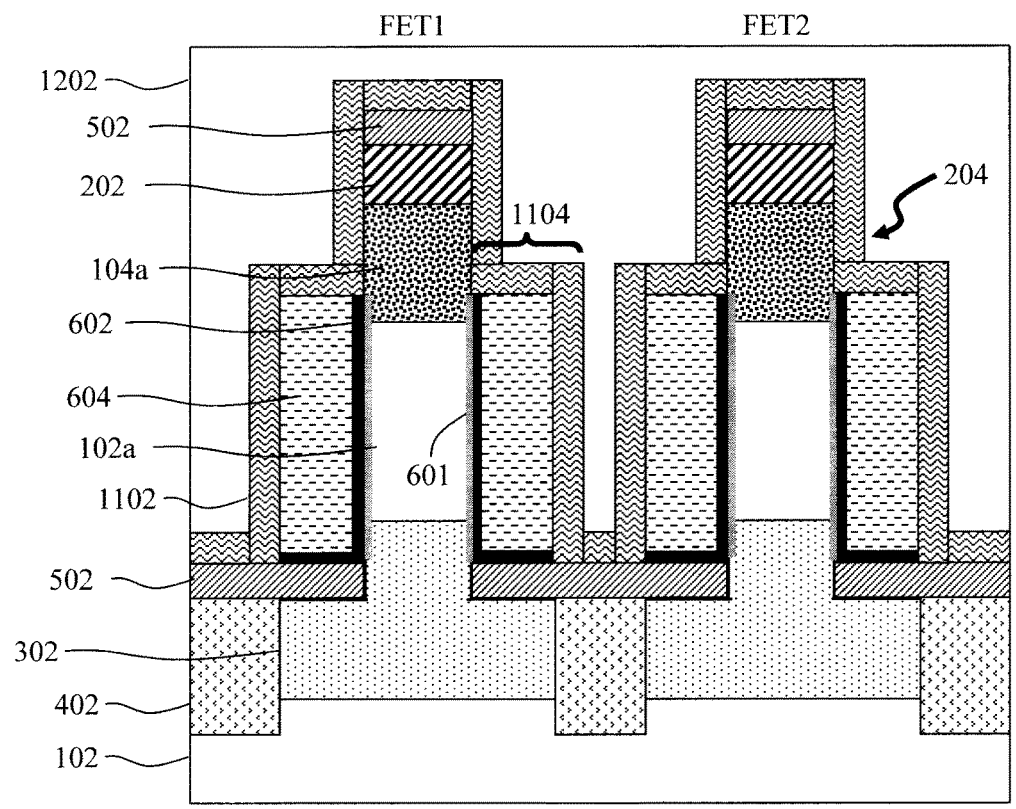
FIG. 12 is a diagram illustrating an interlayer dielectric (ILD) having been blanket deposited over the encapsulation layer, filling the spaces between the fins according to an embodiment of the present invention.
Figure 13:
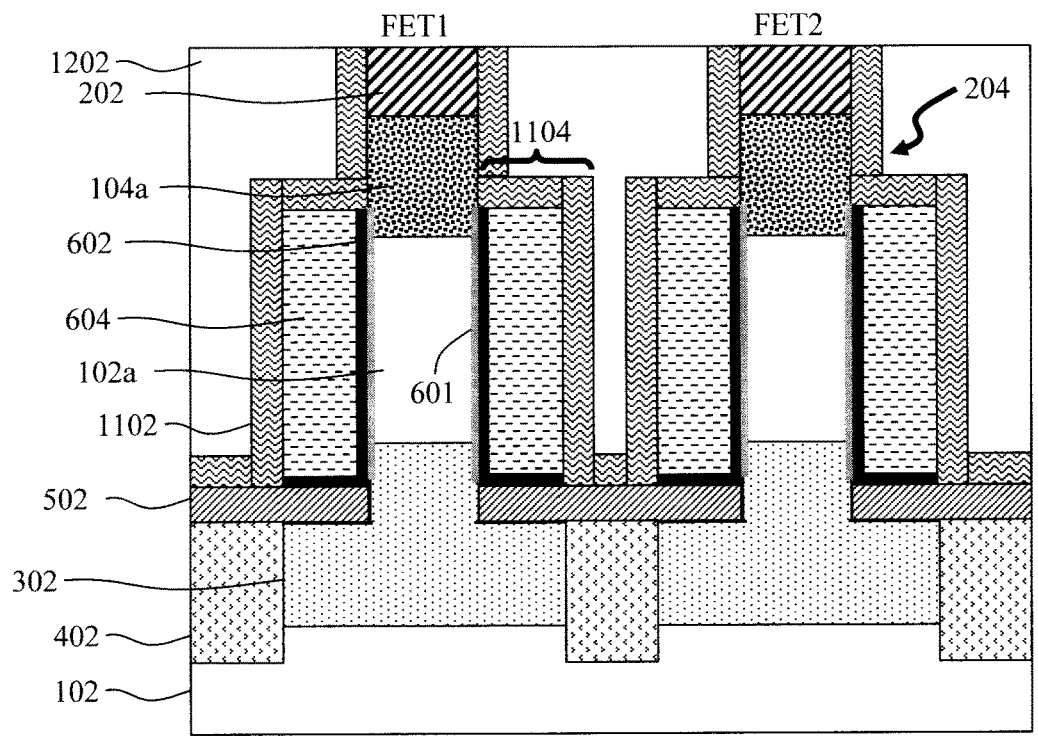
FIG. 13 is a diagram illustrating excess ILD having been removed to expose the tops of the fin hardmasks according to an embodiment of the present invention.

A conformal encapsulation layer 1102 is then formed on the fins 204, bottom spacer 502, and gate conductor 604. See FIG. 11. As shown in FIG. 11, formation of the encapsulation layer 1102 provides top spacers 1104 over the gate. The top spacers 1104 and the counterpart bottom spacer 502 on top of the bottom source and drain 302 and the STI 402 serve to offset the gate from the top and bottom source and drains, respectively. Suitable materials for the encapsulation layer 1102 include, but are not limited to, oxide materials such as $SiO_2$ and/or silicon oxycarbide (SiOC) and nitride materials such as SiN and/or SiBN. According to an exemplary embodiment, the encapsulation layer 1102 and the bottom spacer 502 are both formed from the same material such that the top spacers 1104 and the bottom spacer 502 are both formed from the same material, e.g., SiOC or SiBN.

To enable further processing of the top source and drains, an interlayer dielectric (ILD) 1202 is next blanket deposited on the encapsulation layer 1102 over the fins 204, filling the spaces between the fins 204. See FIG. 12. Suitable ILD materials include, but are not limited to, oxide dielectric materials such as $SiO_2$. Excess ILD 1202 is then removed, exposing the tops of the fin hardmasks 202. See FIG. 13. A process such as chemical-mechanical polishing (CMP) can be employed in this step to polish the ILD 1202 down to the fin hardmasks 202.

Figure 14:
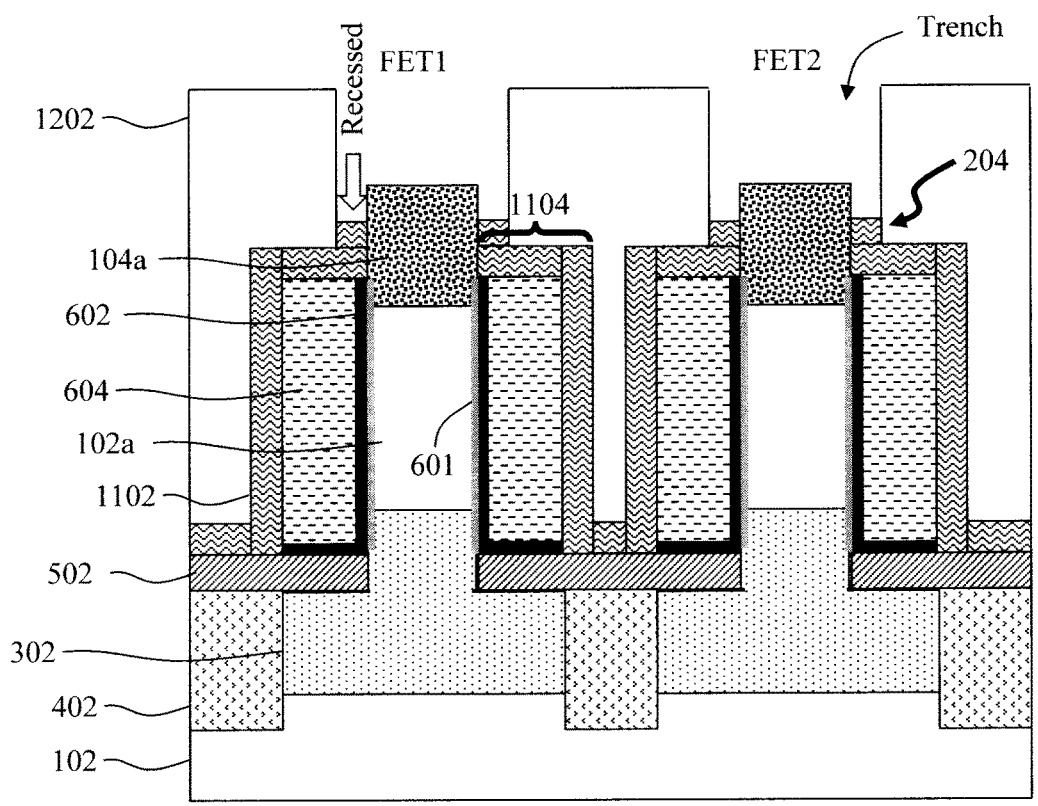
FIG. 14 is a diagram illustrating the fin hardmasks having been removed forming trenches in the ILD above each of the fins according to an embodiment of the present invention.

Once exposed, the fin hardmasks 202 are then removed. See FIG. 14. The fin hardmasks 202 can be removed using a nitride-selective etching process such as a nitride-selective reactive ion etching (RIE). As provided above, (like the fin hardmasks 202) the encapsulation layer 1102 can also be formed from a nitride material such as SiN. Thus, the encapsulation layer 1102 at the tops of the fins 204 will be removed along with the fin hardmasks 202. Namely, as shown in FIG. 14 the encapsulation layer 1102 is now recessed below the top of the doped epitaxial portion 104a of each fin 204. However, if the encapsulation layer 1102 is a different material than the fin hardmasks 202, the encapsulation layer 1102 can be selectively recessed to the appropriate depth after the removal of fin hardmasks 202. The doped epitaxial portion 104a of each fin 204 is now exposed.

As shown in FIG. 14, removal of the fin hardmasks 202 forms trenches in the ILD 1202 above each of the fins 204. The doped epitaxial portion 104a of each fin 204 is exposed at the bottoms of the trenches. The process to adjust the positioning of the top source and drains relative to the gate begins by forming sacrificial spacers 1502 along the sidewalls of the trenches above each of the fins 204. Suitable materials for forming the sacrificial spacers 1502 include, but are not limited to, nitride spacer materials such as SiN and/or SiBN, or oxide spacer materials such as $SiO_2$ and/or SiOC. According to an exemplary embodiment, the sacrificial spacers 1502 are formed by depositing the respective spacer material into and filling the trenches, and then using an anisotropic etching process such as RIE to pattern the spacer material into the individual sacrificial spacers 1502 alongside the sidewalls of the trenches.

Figure 15:
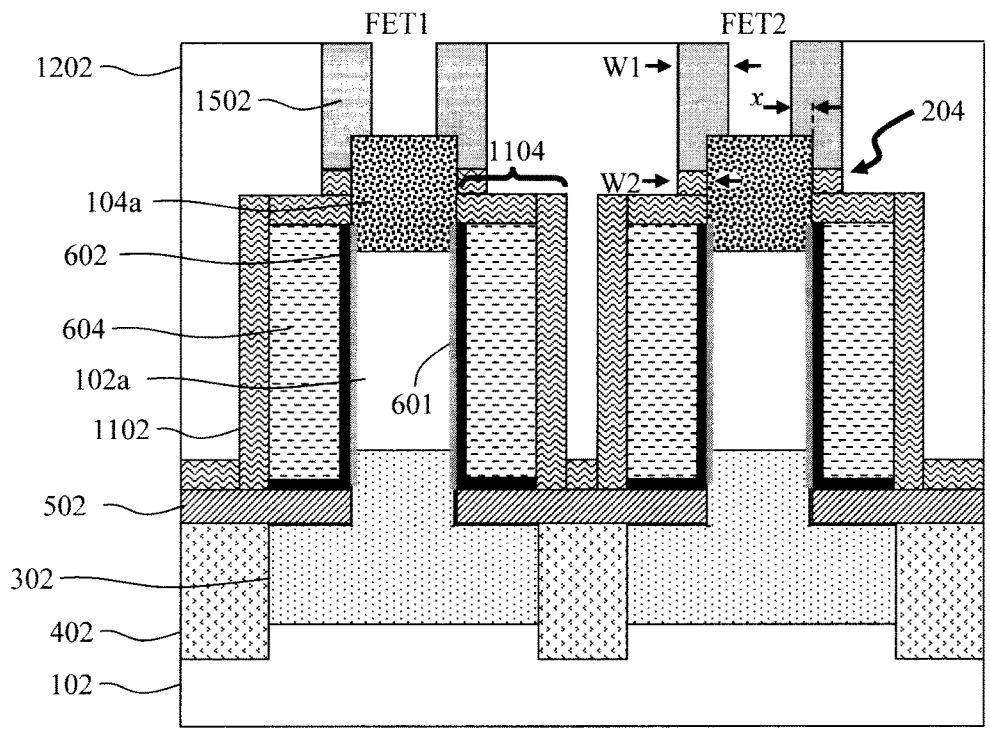
FIG. 15 is a diagram illustrating sacrificial spacers having been formed along sidewalls of the trenches above each of the fins according to an embodiment of the present invention.

As will become apparent from the description that follows, the sacrificial spacers 1502 will be used during a recess etch into FET2 (to adjust the positioning of the top source and drains in the FET2) to insure that a sliver of the vertical fin channel material remains separating the gate from the top source and drain regions in the (nominal) VFET devices (FET2 in this example). Thus, as shown in FIG. 15 the sacrificial spacers 1502 are configured to cover side portions of the doped epitaxial portion 104a and underlying vertical fin channel portion 102a of each fin 204 thereby preventing a sliver of the doped epitaxial portion 104a and underlying vertical fin channel portion 102a of the fin 204 in FET2 from being recessed. For instance, the sacrificial spacers 1502 overlap the sides of the doped epitaxial portion 104a by a distance x, wherein x is from about 1 nm to about 5 nm and ranges therebetween, e.g., 2 nm. According to an exemplary embodiment, the sacrificial spacers 1502 are formed having a width W1 and the encapsulation layer 1102 is formed having a width W2, wherein W1>W2. See FIG. 15.

Up to this point, for ease of manufacture, all VFET devices have been processed the same (i.e., FET1 and FET2 have identical structures) even though the sacrificial spacers 1502 will only be used in the (nominal) VFET (FET2). However, selective processing is now needed to adjust the positioning of the top source and drains in the (nominal) VFET (FET2 in this example). To do so, a block mask 1602 is formed covering the (wimpy) VFET (FET1 in this example). See FIG. 16. Suitable block mask materials include, but are not limited to, photoresist materials such as OPL, oxide materials such as $SiO_2$ and/or SiOC and nitride materials such as SiN and/or SiBN.

Figure 16:
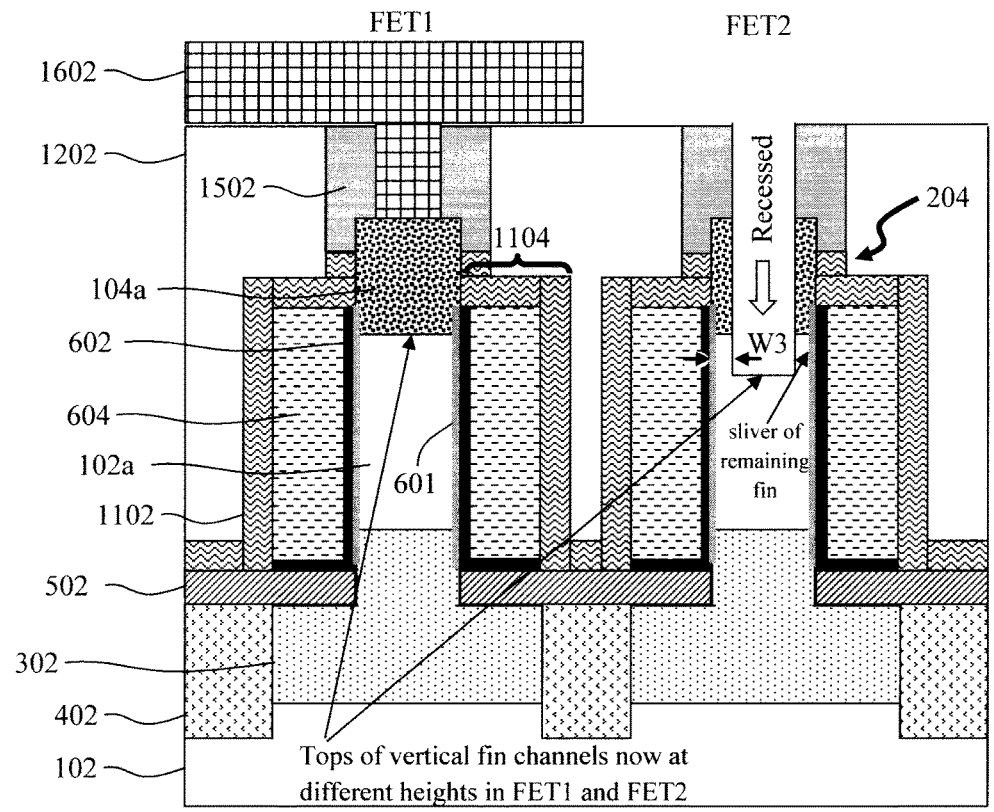
FIG. 16 is a diagram illustrating a block mask having been formed covering the FET1 and a recess etch having been performed in FET2, varying a height of the vertical fin channel in FET2 relative to FET1 according to an embodiment of the present invention.
Figure 17:
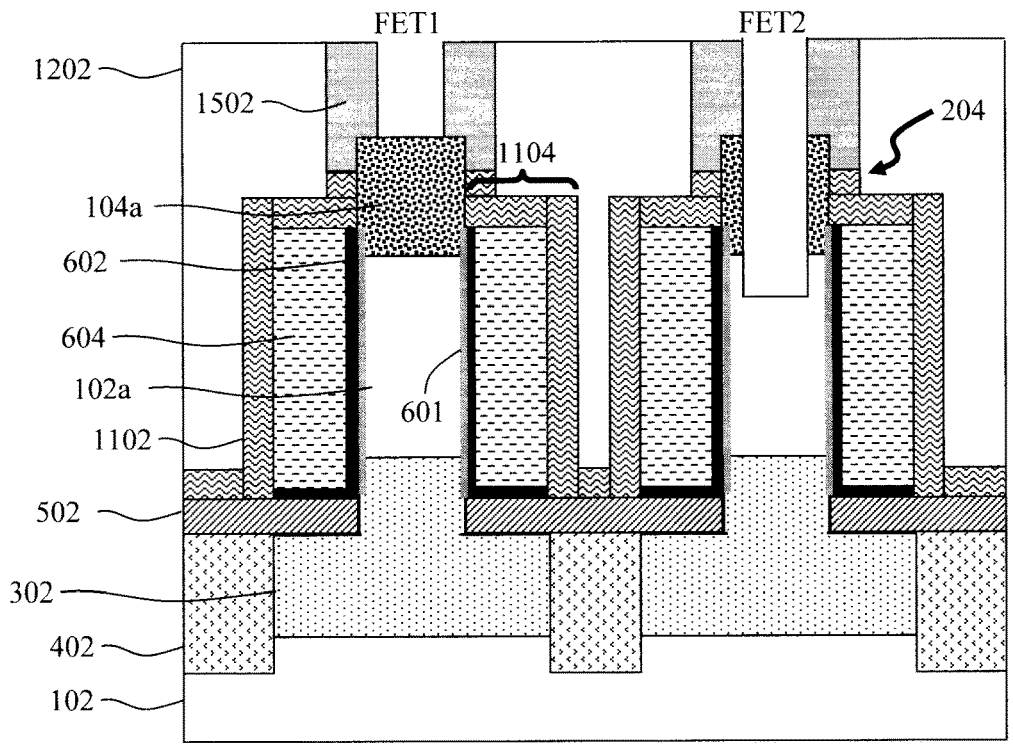
FIG. 17 is a diagram illustrating the block mask having been removed from FET1 according to an embodiment of the present invention.

An etch (an anisotropic etch such as RIE) is then performed between the sacrificial spacers 1502 in the (nominal) VFET (FET2) to recess the doped epitaxial portion 104a and underlying vertical fin channel portion 102a of the fin 204 in FET2. As shown in FIG. 16, following the recess a top of the vertical fin channel portion 102a of the fin 204 in FET2 is below a top of the vertical fin channel portion 102a of the fin 204 in FET1. As also shown in FIG. 16, positioning the sacrificial spacers 1502 so as to overlap the doped epitaxial portion 104a (see above) results in a sliver of the fin 204 remaining between the recess and the gate. That sliver of remaining fin will prevent exposing and damaging the interfacial oxide 601, gate dielectric 602 and gate conductor 604. As provided above, the sacrificial spacers 1502 are configured to overlap the sides of the doped epitaxial portion 104a by a distance x of from about 1 nm to about 5 nm and ranges therebetween, e.g., 2 nm. Thus, the sliver of remaining fin will have a width W3 (see FIG. 16) that is equal to x (i.e., W3=x).

Figure 18:
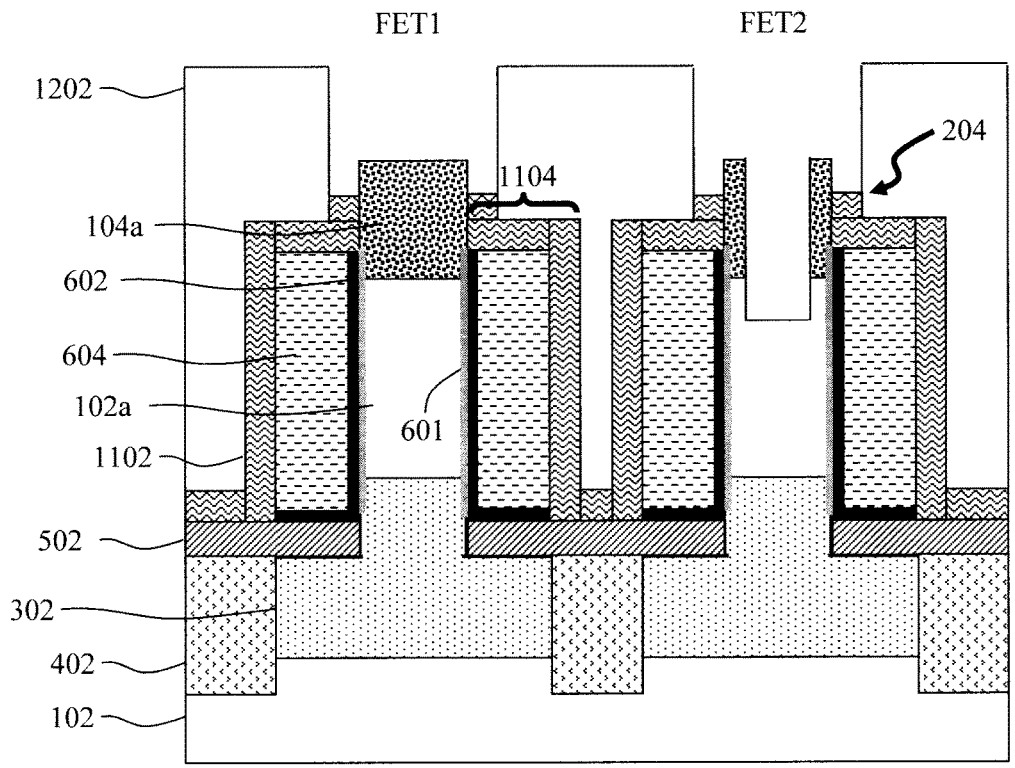
FIG. 18 is a diagram illustrating the sacrificial spacers having been removed according to an embodiment of the present invention.

Following the selective recess etch in FET2, the block mask 1602 is removed from FET1. See FIG. 17. FET1 and FET2 will again be processed together. Namely, as shown in FIG. 18 the sacrificial spacers 1502 are removed from both FET1 and FET2 (see FIG. 18) and top source and drains 1902 and 1904 are formed in FET1 and FET2, respectively (see FIG. 19). In FET1 the top source and drains 1902 are formed on the doped epitaxial portion 104a of the fin 204, whereas in FET2 the top source and drains 1904 are formed in the recessed doped epitaxial portion 104a/vertical fin channel portion 102a of the fin 204. According to an exemplary embodiment, the top source and drains 1902 and 1904 are formed from epitaxial Si, Ge and/or SiGe that is in-situ (during epitaxial growth) or ex-situ (such as via ion implantation) doped with an n-type or p-type dopant. As provided above, suitable n-type dopants include, but are not limited to, phosphorous (P) and/or arsenic (As), and suitable p-type dopants include, but are not limited to, boron (B).

Figure 19:
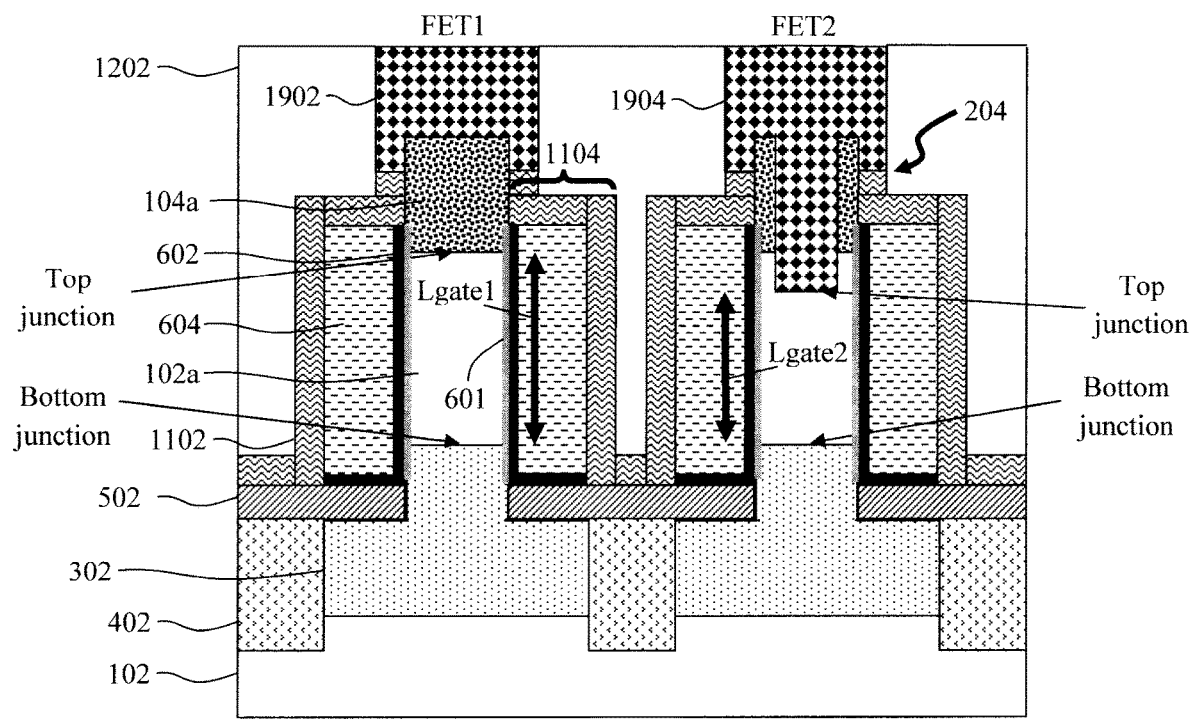
FIG. 19 is a diagram illustrating top source and drains having been formed with a different positioning in FET1 and FET2 according to an embodiment of the present invention.

As shown in FIG. 19, the top source and drains 1902 and 1904 have different positioning vis-à-vis their respective vertical fin channel portion 102a of the fins 204 giving FET1 and FET2 different effective gate lengths Lgate1 and Lgate2, respectively. Specifically, both FET1 and FET2 have a bottom junction at the interface between the bottom source and drains 302 and the vertical fin channel portion 102a of the fins 204. FET1 has a top junction at the interface between the vertical fin channel portion 102a and the doped epitaxial portion 104a of the fin 204. By contrast, FET2 has its top junction at the interface between the vertical fin channel portion 102a and the top source and drain 1904. The longer effective gate length Lgate1 in FET1 results in a wimpy VFET while the shorter effective gate length Lgate2 in FET2 results in a nominal VFET (i.e., Lgate1>Lgate2).

Further, it is notable that while FET1 and FET2 have different effective gate lengths, FET1 and FET2 have the same physical gate length. Namely, as provided above, the gates (gate dielectric 602 and gate conductor 604) were co-fabricated in FET1 and FET2. Thus, the gates in FET1 and FET2 are physically the same. However, due to the selective placement of the top source and drains, the effective gate lengths (Lgate) in FET1 and FET are different.

In the process flow just described a selective recess etch of FET2 only was used to adjust the positioning of the top source and drain to produce VFETs with differing effective gate lengths (Lgate) on the same chip. According to another exemplary embodiment, this same process of a selective recess etch is used in both FET1 and FET2 with the recess being deeper in FET2 than in FET1 to produce VFETs with differing effective gate lengths (Lgate) on the same chip. This alternative exemplary embodiment is described by way of reference to FIGS. 20-26.

A number of the processes in this alternative embodiment are the same as shown and described above. Thus, for ease and clarity of description, steps which have already been individually depicted above may in some instance be combined into a single figure.

Since the placement of the top source and drains will be adjusted in both the (wimpy) FET1 and (nominal) FET2 based on the depth of the recess, a notable difference in this process flow is that a doped epitaxial layer 104 is not needed on the starting substrate. Namely, referring to FIG. 20, the process begins simply with an undoped substrate 2002. According to an exemplary embodiment, substrate 2002 is a bulk semiconductor wafer, such as a bulk Si, bulk Ge, bulk SiGe and/or III-V semiconductor wafer. Alternatively, substrate 2002 can be an SOI wafer having an SOI layer (e.g., Si, Ge, SiGe and/or III-V semiconductor) separated from an underlying substrate by a buried insulator such as a buried oxide or BOX.

Figure 20:
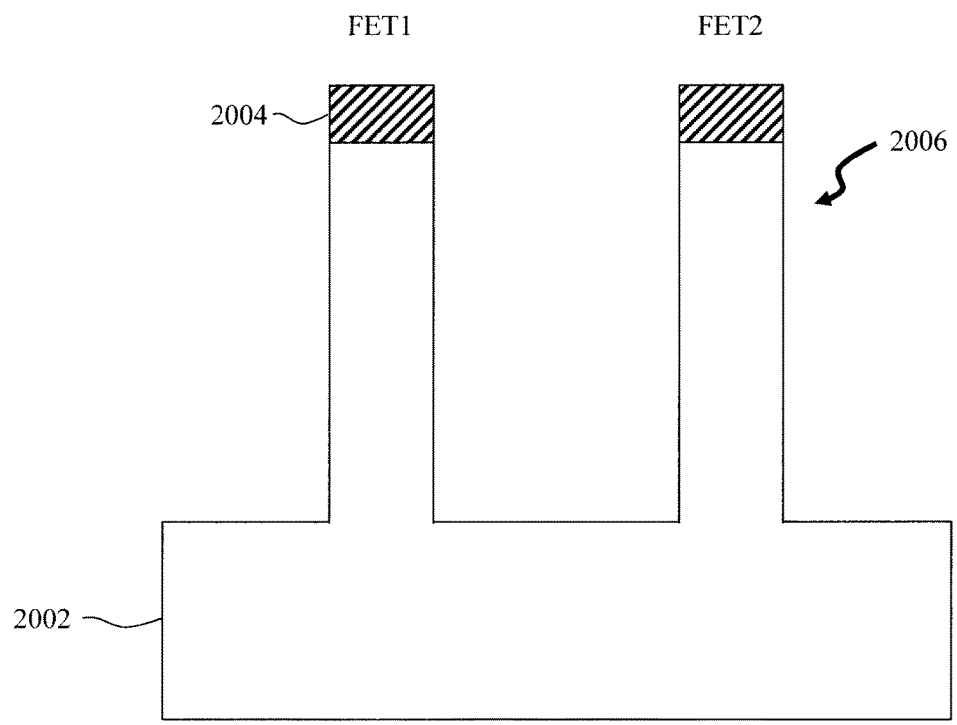
FIG. 20 is a diagram illustrating fins having been patterned in a substrate that extend partway into the substrate, the fins corresponding to at least one first VFET device (FET1) and at least one second VFET device (FET2) according to an embodiment of the present invention.

As shown in FIG. 20, a patterned fin hardmask 2004 is formed on the substrate 2002 marking the footprint and location of multiple fins. Suitable hardmask materials include, but are not limited to, nitride hardmask materials such as SiN. An etch with the fin hardmasks 2004 is then used to pattern fins 2006 in the substrate 2002. An anisotropic etching process such as RIE can be employed for the fin etch.

As shown in FIG. 20, the fin etch extends partway into the substrate 2002, with a portion of the substrate 2002 remaining intact beneath each of the fins 2006. Each of the fins 2006 will serve as the (undoped) vertical fin channel of a FET. As above, this example involves forming at least one (wimpy) VFET having the (longer) gate length Lgate1 (i.e., FET1) and at least one (nominal) VFET having the (shorter) gate length Lgate2 (i.e., FET2) on the same chip. The fins 2006 that will be used in fabricating each of these devices are labeled "FET1" and "FET2," respectively.

As in the process flow above, a process such as ion implantation is now used to form a bottom source and drain 2102 in the substrate 2002 beneath the fins 2006. See FIG. 21. As provided above, suitable n-type dopants include phosphorous and/or arsenic, and suitable p-type dopants include, but are not limited to, boron. An (undoped) portion 2002a of each of the fins 2006 above the bottom source and drain 2102 serves as the vertical fin channel of the respective FET (i.e., FET1 and FET2).

After formation of the bottom source and drain 2102, STI regions 2104 are formed in the substrate 2002 in between the fins 2006. As described above, the STI regions 2104 serve to isolate the VFET devices (i.e., FET1 and FET2) from one another.

A bottom spacer 2106 is next formed on the bottom source and drain 2102 and on the fin hardmasks 2004. As provided above, suitable materials for the bottom spacer 2106 include, but are not limited to, oxide spacer materials such as $SiO_2$ and/or SiOC and/or nitride spacer materials such as SiN and/or SiBN.

According to an exemplary embodiment, the bottom spacer 2106 is formed using a directional deposition process whereby the spacer material is deposited onto the bottom source and drain 2102, fin hardmasks 2004 and fins 2006 with a greater amount of the material being deposited on horizontal surfaces (including on top of the bottom source and drain 2102 in between the fins 2006 and on top of the fin hardmasks 2004), as compared to vertical surfaces (such as along sidewalls of the fins 2006). Thus, when an etch is used on the spacer material, the timing of the etch needed to remove the spacer material from the vertical surfaces will leave the bottom spacer 2106 shown in FIG. 21 on the bottom source and drain 2102 (and also on the fin hardmasks 2004—however in FIG. 21 the bottom spacer 2106 on top of the fin hardmasks 2004 has already been removed) since a greater amount of the spacer material was deposited on the bottom source and drain 2102 and on the fin hardmasks 2004. By way of example only, a HDP CVD or PVD process can be used for directional film deposition, and an oxide- or nitride-selective (depending on the spacer material) isotropic etch can be used to remove the (thinner) spacer material deposited onto the vertical surfaces.

Next, a gate (i.e., a gate dielectric and a gate conductor) is formed surrounding each of the fins 2006. To form the gate, an interfacial oxide 2107 (e.g., $SiO_2$ which may include other chemical elements in it such as nitrogen, germanium, etc.) is first formed selectively on exposed (e.g., Si/SiGe) surfaces of the fins 2006 by an oxidation process to a thickness of from about 0.3 nm to about 5 nm, and ranges therebetween, e.g., about 1 nm. A conformal gate dielectric 2108 is deposited onto the fins 2006 over the interfacial oxide 2107 and over the bottom spacers 2106, and a conformal gate conductor 2110 is deposited onto the gate dielectric 2108. According to an exemplary embodiment, a metal gate is formed wherein the gate conductor 2110 is a metal or combination of metals and the gate dielectric 2108 is a high-κ dielectric. For instance, the gate conductor 2110 is a workfunction setting metal. The particular workfunction metal employed can vary depending on whether an n-type or p-type transistor is desired. As provided above, suitable n-type workfunction setting metals include, but are not limited to, TiN, TaN and/or Al-containing alloys such as TiAl, TiAlN, TiAlC, TaAl, TaAlN, and/or TaAlC. Suitable p-type workfunction setting metals include, but are not limited to, TiN, TaN, and W. Suitable high-κ gate dielectrics include, but are not limited to, $HfO_2$ and/or $La_2O_3$.

The gate dielectric 2108 and gate conductor 2110 are deposited as conformal layers covering the fins 2006 and, in the same manner as described above, the gate dielectric 2108 and gate conductor 2110 are recessed to expose the tops of the fins 2006 in order to permit formation of the top source and drain regions. The individual steps used to recess the gate dielectric 2108 and gate conductor 2110 using, for example a directional etching and a dielectric such as an OPL (not shown) masked etching, are described in conjunction with the description of FIGS. 6-10, above.

Since the gates are being co-fabricated for each of the VFET devices, the gates are physically identical in FET1 and FET2 meaning that the physical gate length of FET1 and FET2 are the same. See FIG. 21. However, as will be described in detail below, the effective gate length of the (wimpy) VFET (Lgate1 of FET1 in this example) vis-à-vis the (nominal) VFET (Lgate2 of FET2 in this example) will be varied relative to one another by adjusting the positioning of the top source and drains relative to the gate. Notably, the way in which this adjustment is made involves separately processing each of FET1 and FET2 to control the recess depth of the vertical fin channel in each device (see below). By contrast, in the process flow provided above, the vertical fin channel of only FET2 was recessed. While selective processing of each of FET1 and FET2 individually involves a tradeoff in terms of needing additional masking steps (see below), the positioning of the top source and drains for both FET1 and FET2 will be set at the end of the process and thus there is no need for a doped epitaxial portion in each fin.

Figure 21:
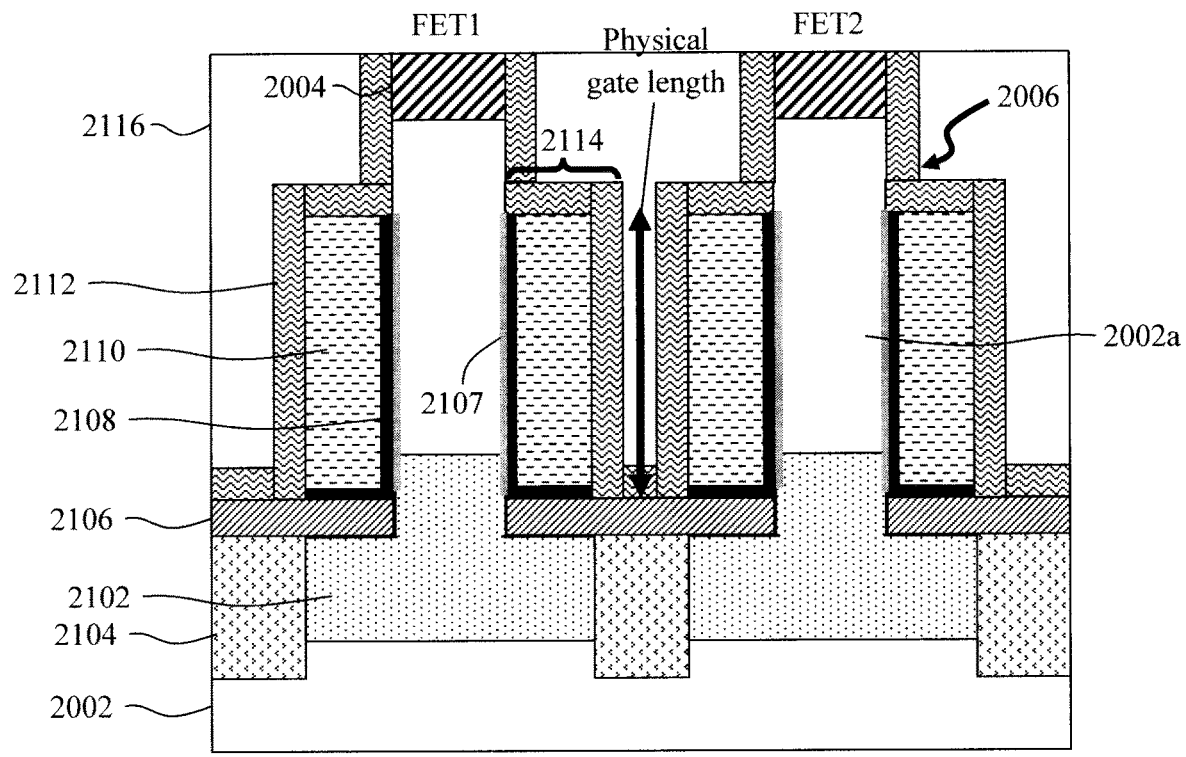
FIG. 21 is a diagram illustrating a bottom source and drain having been formed in the substrate beneath the fins, STI regions having been formed in the substrate between the fins, a bottom spacer having been formed on the bottom source and drain, a gate having been formed surrounding each of the fins, a conformal encapsulation layer having been formed on the fins and gate providing top spacers over the gate, and an ILD having been deposited over the encapsulation layer according to an embodiment of the present invention.

As shown in FIG. 21, a conformal encapsulation layer 2112 is formed on the fins 2006, bottom spacer 2106, and gate conductor 2110. Formation of the encapsulation layer 2112 provides top spacers 2114 over the gate. The top spacers 2114 and the counterpart bottom spacer 2106 serve to offset the gate from the top and bottom source and drains, respectively. Suitable materials for the encapsulation layer 2112 include, but are not limited to, oxide materials such as $SiO_2$ and/or silicon oxycarbide (SiOC), and nitride materials such as SiN and/or SiBN. According to an exemplary embodiment, the encapsulation layer 2112 and the bottom spacer 2106 are both formed from the same material such that the top spacers 2114 and the bottom spacer 2106 are both formed from the same material, e.g., SiOC or SiBN.

An ILD 2116 is blanket deposited over the encapsulation layer 2112, filling the spaces between the fins 2006, and then polished (e.g., using CMP) down to, and exposing, the fin hardmasks 2004. As provided above, suitable ILD materials include, but are not limited to, oxide dielectric materials such as $SiO_2$. See FIG. 21.

Figure 22:
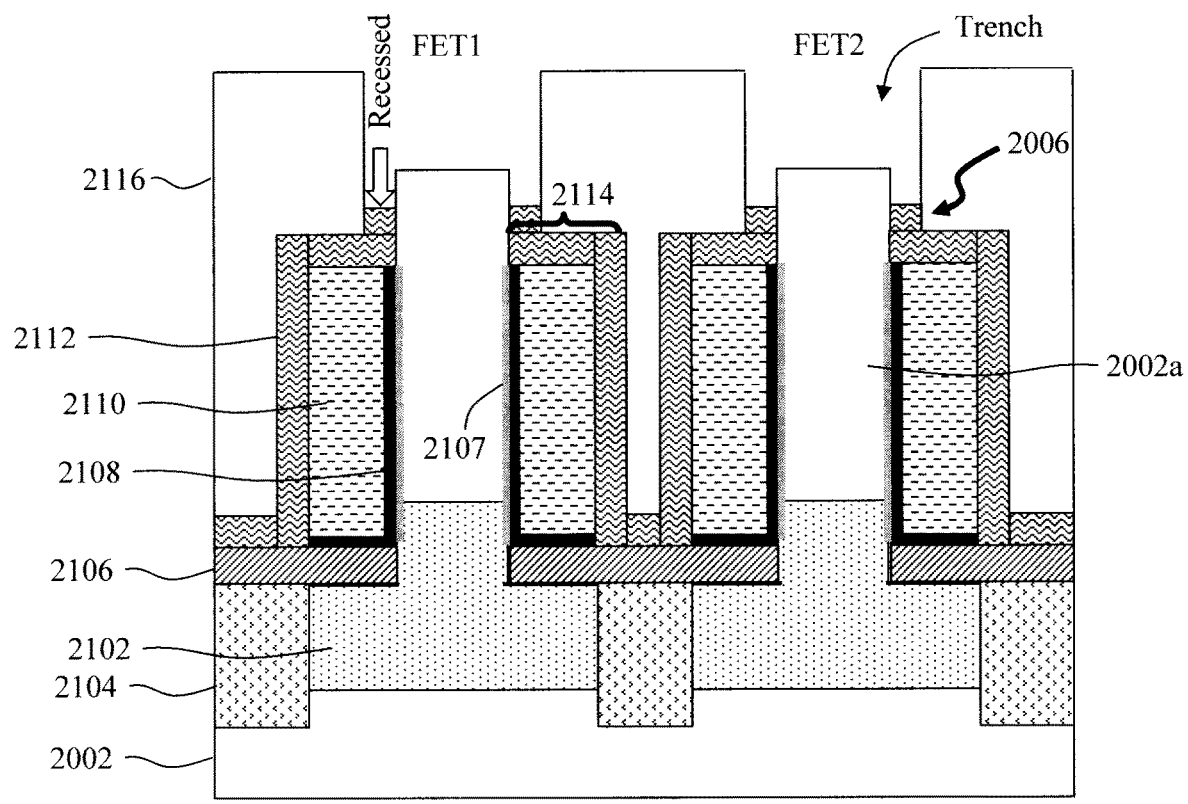
FIG. 22 is a diagram illustrating the fin hardmasks having been removed forming trenches in the ILD above each of the fins according to an embodiment of the present invention.

Once exposed, the fin hardmasks 2004 are then removed. See FIG. 22. The fin hardmasks 2004 can be removed using a nitride-selective etching process such as a nitride-selective RIE. As provided above, (like the fin hardmasks 2004) the encapsulation layer 2112 can also be formed from a nitride material such as SiN. Thus, the encapsulation layer 2112 at the tops of the fins 2006 will be removed along with the fin hardmasks 2004. Namely, as shown in FIG. 22 the encapsulation layer 2112 is now recessed below the tops of the vertical fin channel portion 2002a of each of the fins 2006. However, if the encapsulation layer 2112 is a different material than the fin hardmasks 2004, the encapsulation layer 2112 can be selectively recessed to the appropriate depth after the removal of fin hardmasks 2004.

As shown in FIG. 22, removal of the fin hardmasks 2004 forms trenches in the ILD 2116 above each of the fins 2006. The vertical fin channel portion 2002a of each fin 2006 is exposed at the bottoms of the trenches. The process to adjust the positioning of the top source and drains relative to the gate begins by forming sacrificial spacers 2302 along the sidewalls of the trenches above each of the fins 2006. As provided above, suitable materials for forming the sacrificial spacers 2302 include, but are not limited to, nitride spacer materials such as SiN and/or SiBN, or oxide spacer materials such as $SiO_2$ and/or SiOC. According to an exemplary embodiment, the sacrificial spacers 2302 are formed by depositing the respective spacer material into and filling the trenches, and then using an anisotropic etching process such as RIE to pattern the spacer material into the individual sacrificial spacers 2302 alongside the sidewalls of the trenches.

Figure 23:
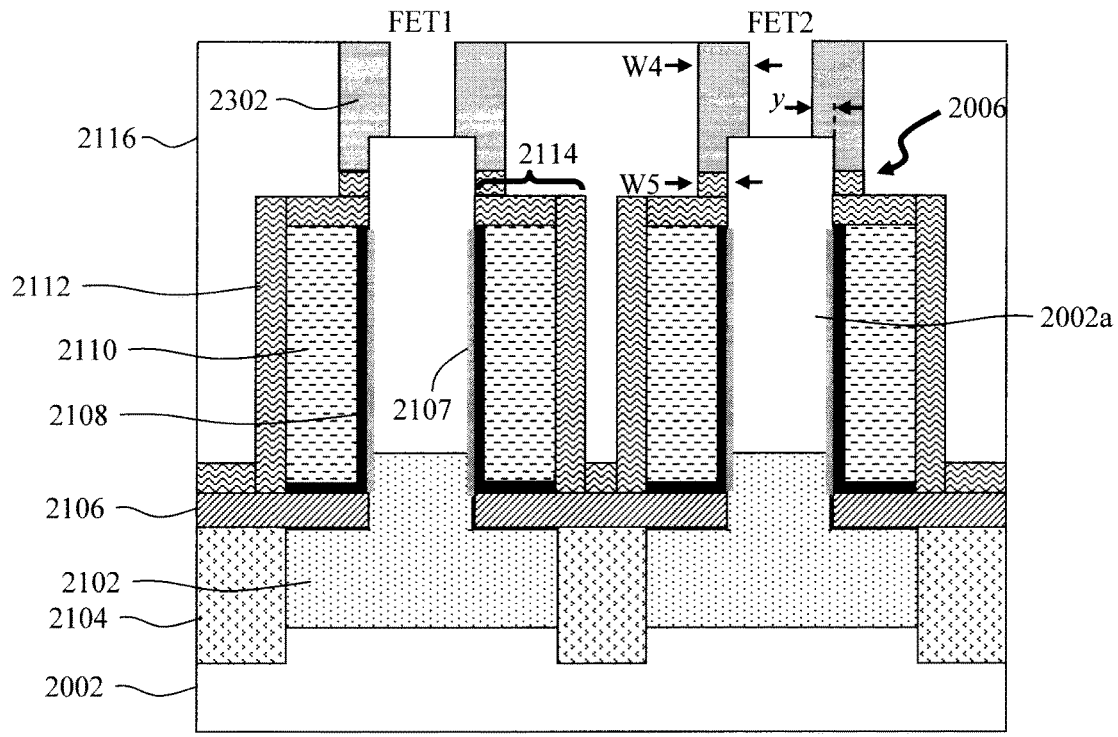
FIG. 23 is a diagram illustrating sacrificial spacers having been formed along sidewalls of the trenches above each of the fins according to an embodiment of the present invention.

As will become apparent from the description that follows, the sacrificial spacers 2302 will be used to selectively perform recess etches to different depths in FET1 and FET2 (to adjust the positioning of the top source and drains) to insure that, following the recess etches, a sliver of the vertical fin channel material remains separating the gate from the top source and drain regions. Thus, as shown in FIG. 23 the sacrificial spacers 2302 are configured to cover the side portions of vertical fin channel portion 2002a of each fin 2006 thereby preventing a sliver of the vertical fin channel portion 2002a of the fins 2006 in FET1 and FET2 from being recessed. For instance, the sacrificial spacers 2302 overlap the sides of the vertical fin channel portion 2002a by a distance y, wherein y is from about 1 nm to about 5 nm and ranges therebetween, e.g., 2 nm. According to an exemplary embodiment, the sacrificial spacers 2302 are formed having a width W4 and the encapsulation layer 2112 is formed having a width W5, wherein W4>W5. See FIG. 23.

Up to this point, all VFET devices have been processed the same (i.e., FET1 and FET2 have identical structures). However, in order to selectively set different recess depths in FET1 and FET2 (to adjust the positioning of the top source and drains) one FET must be masked while the other is processed, and vice versa. In the present example FET1 will be masked first while a top recess etch is performed in FET2. The process is repeated by next masking FET2 and performing a top recess etch (to a different depth) in FET2. This sequence is however arbitrary and either FET1 or FET2 can be masked/recessed before the other.

Figure 24:
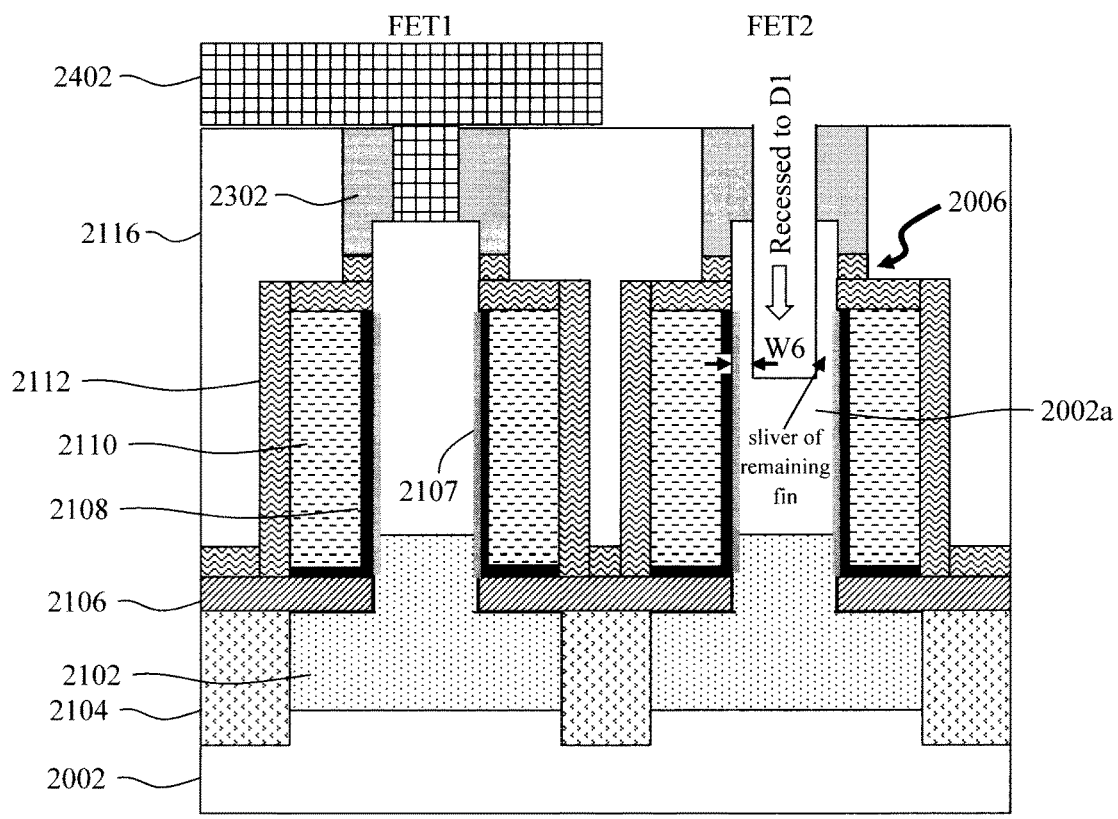
FIG. 24 is a diagram illustrating a (first) block mask having been formed covering the FET1 and a recess etch having been performed in FET2 to a depth D1 according to an embodiment of the present invention.

As shown in FIG. 24, a block mask 2402 is formed covering the (wimpy) VFET (FET1 in this example). As provided above, suitable block mask materials include, but are not limited to, photoresist materials such as OPL, oxide materials such as $SiO_2$ and/or SiOC, and nitride materials such as SiN and/or SiBN.

An etch (an anisotropic etch such as RIE) is then performed between the sacrificial spacers 2302 in the (nominal) VFET (FET2 in this example) to recess the vertical fin channel portion 2002a of the fin 2006 in FET2 to a depth D1. As shown in FIG. 24, positioning the sacrificial spacers 2302 so as to overlap the vertical fin channel portion 2002a (see above) results in a sliver of the fin 2006 remaining between the recess and the gate. That sliver of remaining fin will prevent exposing and damaging interfacial oxide 2107, gate dielectric 2108 and gate conductor 2110. As provided above, the sacrificial spacers 2302 are configured to overlap the sides of the vertical fin channel portion 2002a by a distance y of from about 1 nm to about 5 nm and ranges therebetween, e.g., 2 nm. Thus, the sliver of remaining fin will have a width W6 (see FIG. 24) that is equal to y (i.e., W6=y).

Figure 25:
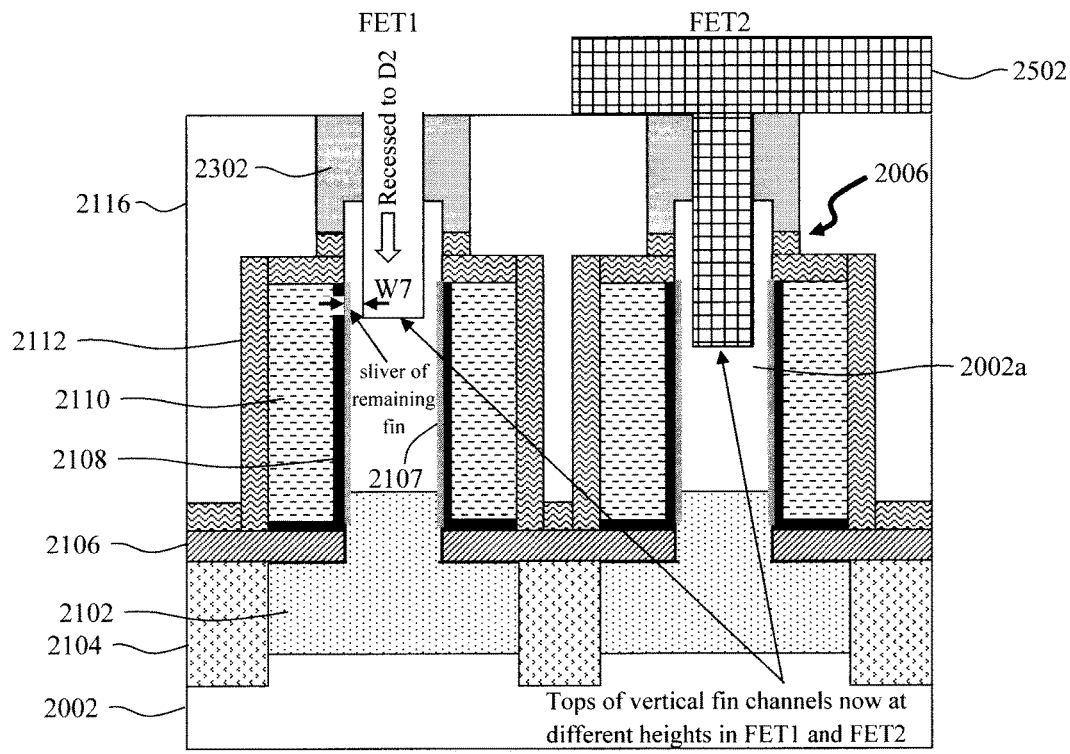
FIG. 25 is a diagram illustrating the first block mask having been removed from the FET1 and a (second) block mask having been formed covering the FET2, and a recess etch having been performed in FET1 to a depth D2, wherein D2<D1 according to an embodiment of the present invention.

The block mask 2402 is removed from the FET1 and the process is repeated to perform a recess etch in FET1 to a depth D2, wherein D2<D1. Namely, as shown in FIG. 25 the block mask 2402 is removed from the FET1 and a block mask 2502 is formed covering the (nominal) VFET (FET2 in this example).

An etch (an anisotropic etch such as RIE) is then performed between the sacrificial spacers 2302 in the (wimpy) VFET (FET1 in this example) to recess the vertical fin channel portion 2002a of the fin 2006 in FET1 to a depth D2, wherein D2<D1. As shown in FIG. 25, following the recess a top of the vertical fin channel portion 2002a of the fin 2006 in FET2 is below a top of the vertical fin channel portion 2002a of the fin 2006 in FET1. As also shown in FIG. 25, positioning the sacrificial spacers 2302 so as to overlap the vertical fin channel portion 2002a (see above) results in a sliver of the fin 2006 remaining between the recess and the gate. That sliver of remaining fin will prevent shorting between the FET1 top source and drains (which will be formed in the recess) and the gate. As provided above, the sacrificial spacers 2302 are configured to overlap the sides of the vertical fin channel portion 2002a by a distance y of from about 1 nm to about 5 nm and ranges therebetween, e.g., 2 nm. Thus, the sliver of remaining fin will have a width W7 (see FIG. 25) that is equal to x (i.e., W7=y).

Figure 26:
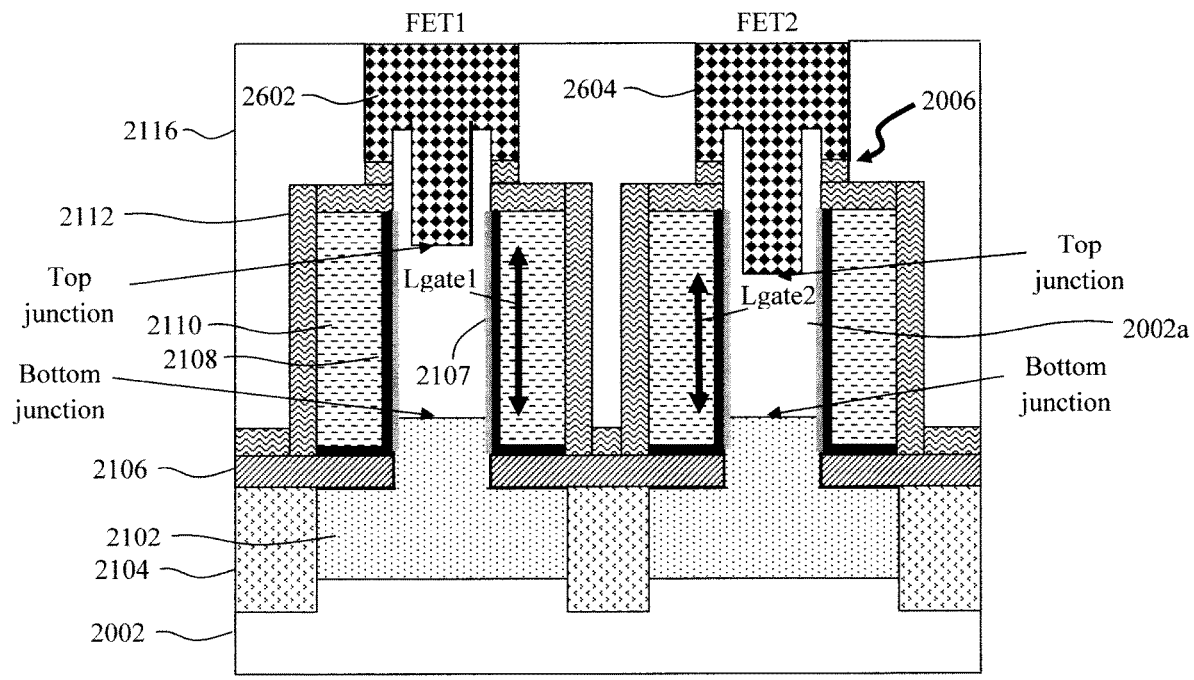
FIG. 26 is a diagram illustrating top source and drains having been formed with a different positioning in FET1 and FET2 according to an embodiment of the present invention.

Following the selective recess etch in FET1, the block mask 2502 is removed from FET2 and, as shown in FIG. 26, the sacrificial spacers 2302 are removed from both FET1 and FET2 and top source and drains 2602 and 2604 are formed in the recesses of FET1 and FET2, respectively. According to an exemplary embodiment, the top source and drains 2602 and 2604 are formed from epitaxial Si, Ge and/or SiGe that is in-situ (during epitaxial growth) or ex-situ (such as via ion implantation) doped with an n-type or p-type dopant. As provided above, suitable n-type dopants include, but are not limited to, phosphorous (P) and/or arsenic (As), and suitable p-type dopants include, but are not limited to, boron (B).

As shown in FIG. 26, based on the different depths of the top recess etch, the top source and drains 2602 and 2604 (formed in the recesses) have different positioning vis-à-vis their respective vertical fin channel portion 2002a of the fins 2006 giving FET1 and FET2 different effective gate lengths Lgate1 and Lgate2, respectively. Specifically, both FET1 and FET2 have a bottom junction at the interface between the bottom source and drains 2102 and the vertical fin channel portion 2002a of the fins 2006. FET1 has a top junction at the interface between the vertical fin channel portion 2002a and the top source and drains 2602 the positioning of which is set by the recess etch depth D2. By contrast, FET2 has its top junction at the interface between the vertical fin channel portion 2002a and the top source and drain 2604 the positioning of which is set by the recess etch depth D1. The longer effective gate length Lgate1 in FET1 results in a wimpy VFET while the shorter effective gate length Lgate2 in FET2 results in a nominal VFET (i.e., Lgate1>Lgate2). Both FET1 and FET2 have the same physical gate lengths.

Further, it is notable that while FET1 and FET2 have different effective gate lengths, FET1 and FET2 have the same physical gate length. Namely, as provided above, the gates (gate dielectric 2108 and gate conductor 2110) were co-fabricated in FET1 and FET2. Thus, the gates in FET1 and FET2 are physically the same. However, due to the selective placement of the top source and drains, the effective gate lengths (Lgate) in FET1 and FET2 are different.

In the examples provided above, the bottom source and drains are formed (e.g., via implantation) following fin patterning. Embodiments are also anticipated herein where a doped epitaxial layer is placed on the substrate prior to fin patterning that will serve as the bottom source and drains below the vertical fin channel. See, for example, methodology 2700 of FIG. 27 and methodology 2800 of FIG. 28. Methodology 2700 of FIG. 27 follows the process flow illustrated in FIGS. 1-19 where a doped epitaxial layer (i.e., doped epitaxial layer 104) is also placed on top of the vertical fin channel. Methodology 2800 of FIG. 28 follows the process flow illustrated in FIGS. 20-26 where no prior doped epitaxial material (i.e., doped epitaxial layer 104) is needed over the vertical fin channels.

Figure 27:
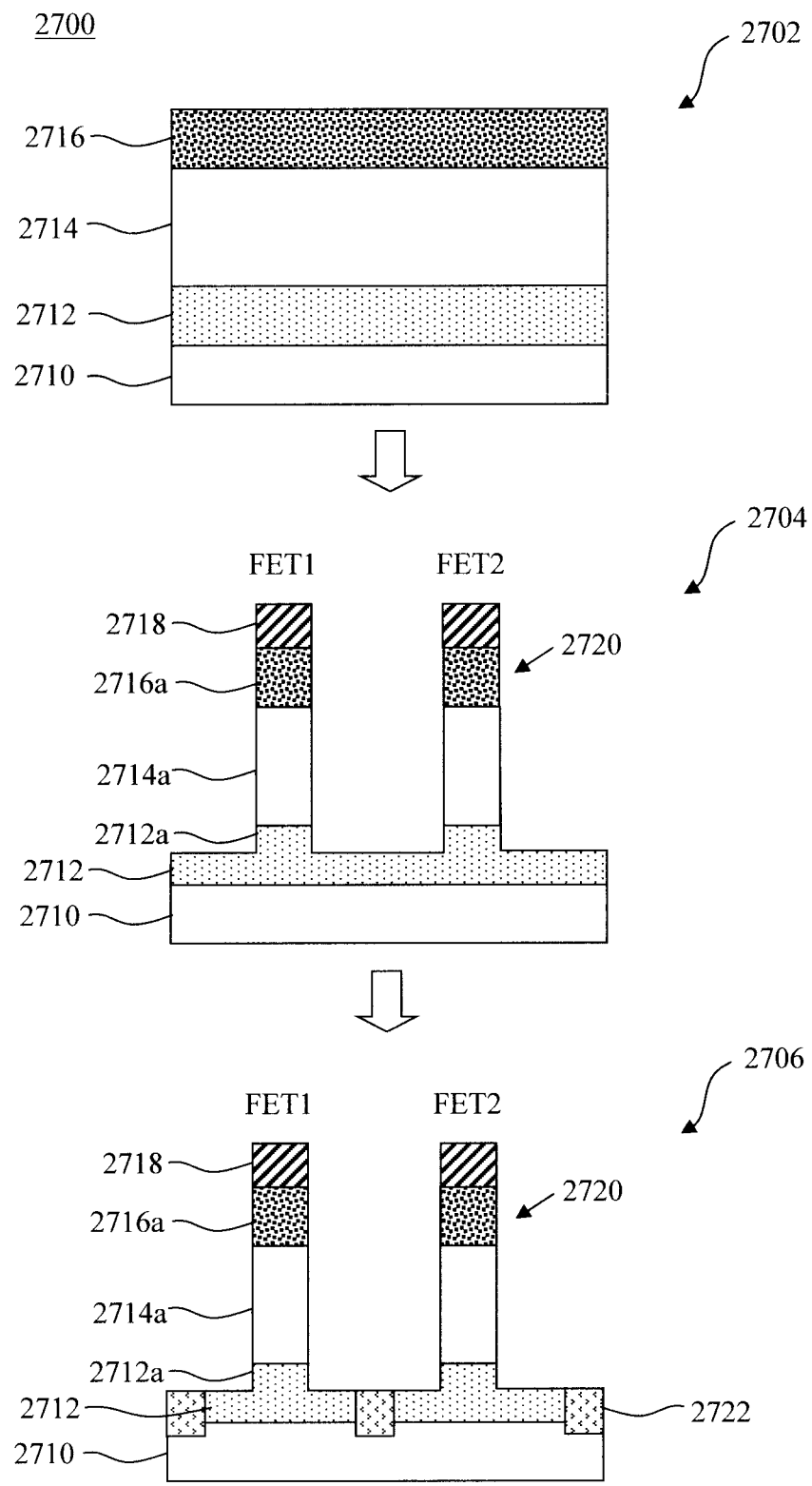
FIG. 27 is a diagram illustrating, according to an alternative embodiment, an exemplary methodology for forming top and bottom source and drain epitaxy on the starting substrate according to an embodiment of the present invention.

Referring first to methodology 2700 of FIG. 27, in step 2702 a first doped epitaxial layer 2712 is formed on a substrate 2710, an undoped epitaxial layer 2714 is formed on the first doped epitaxial layer 2712, and a second doped epitaxial layer 2716 is formed on the undoped epitaxial layer 2714. Suitable (bulk and SOI) substrate 2710 configurations were provided above. In-situ or ex-situ doping can be used to dope epitaxial layers 2712 and 2716. By way of example only, epitaxial layers 2712 and 2716 can be formed from doped epitaxial SiGe and undoped epitaxial layer 2714 can be formed from epitaxial Si, or vice versa.

In the same manner as described above, fin hardmasks 2718 are formed on top of the stack (i.e., substrate 2710/first doped epitaxial layer 2712/undoped epitaxial layer 2714/second doped epitaxial layer 2716) and used to pattern fins 2720 in the stack corresponding to at least one FET1 and at least one FET2. See step 2704. As shown in step 2704, the fins 2720 extend completely through the second doped epitaxial layer 2716 and the undoped epitaxial layer 2714, and partway through the first doped epitaxial layer 2712. As such, each fin 2720 includes a portion 2712a (formed from first doped epitaxial layer 2712—which will serve as the bottom source and drain), a portion 2714a (formed from the undoped epitaxial layer 2714—which will serve as the vertical fin channel), and a portion 2716a (formed from the second doped epitaxial layer 2716—which will be used in the top source and drains).

Figure 5:
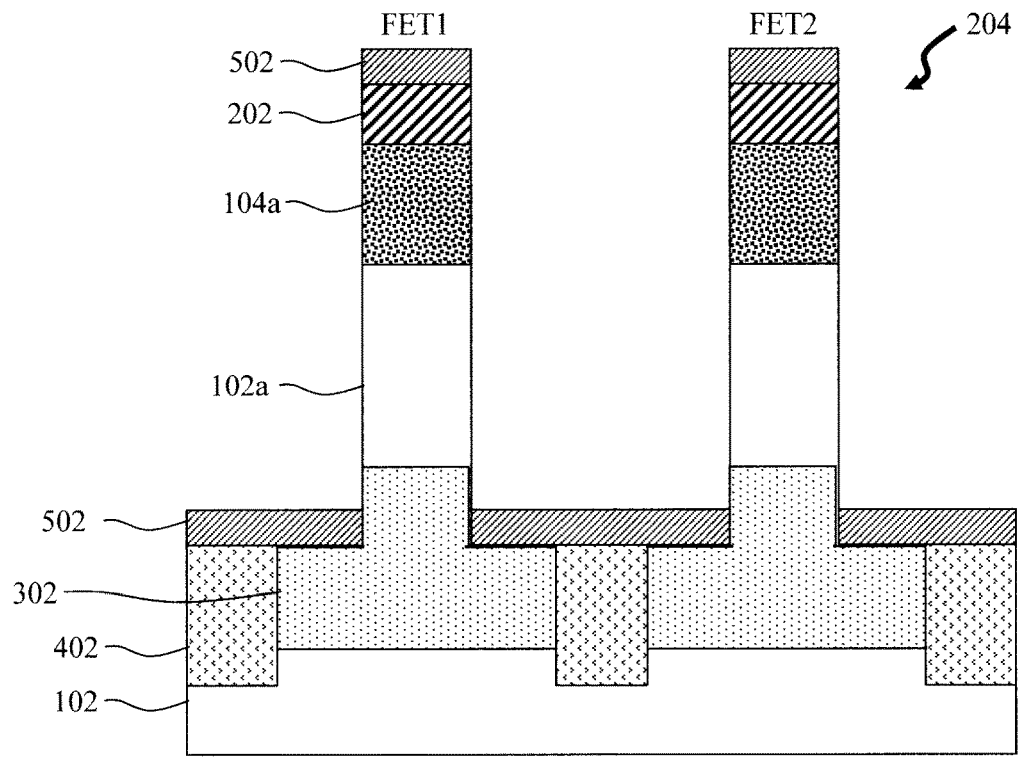
FIG. 5 is a diagram illustrating a bottom spacer having been formed on the bottom source and drain according to an embodiment of the present invention.
Figure 6:
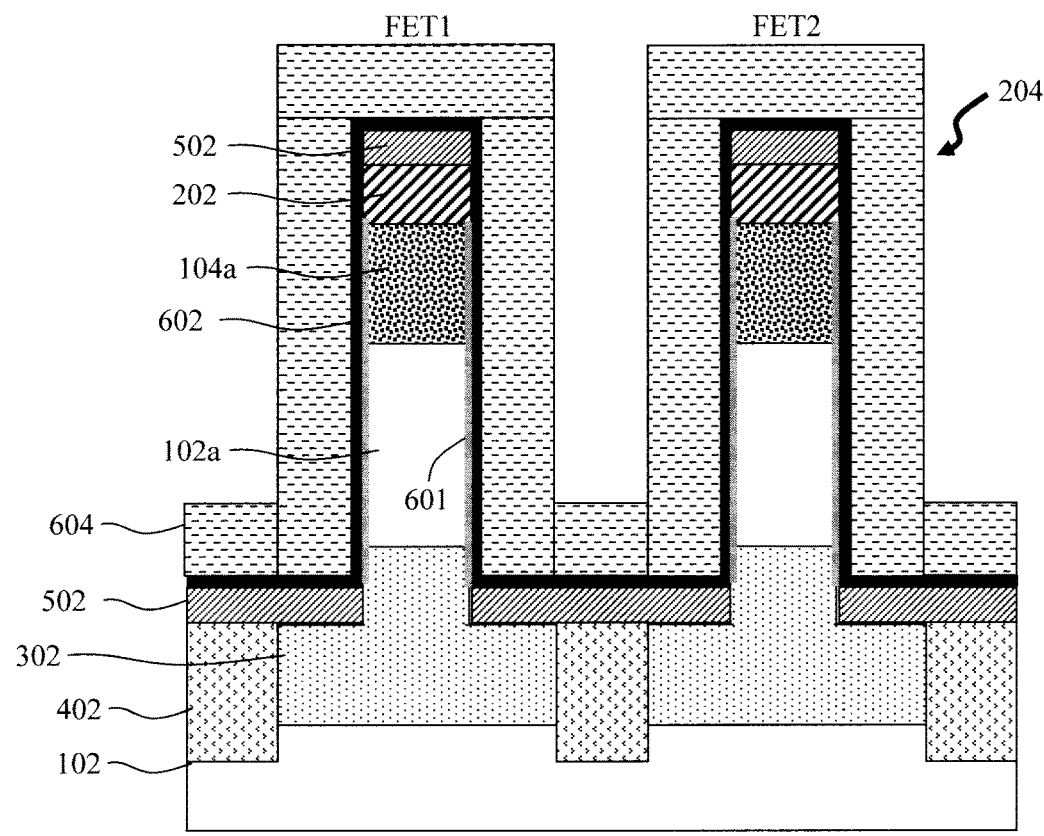
FIG. 6 is a diagram illustrating a conformal gate dielectric having been deposited onto the fins, and a conformal gate conductor having been deposited onto the gate dielectric according to an embodiment of the present invention.
Figure 7:
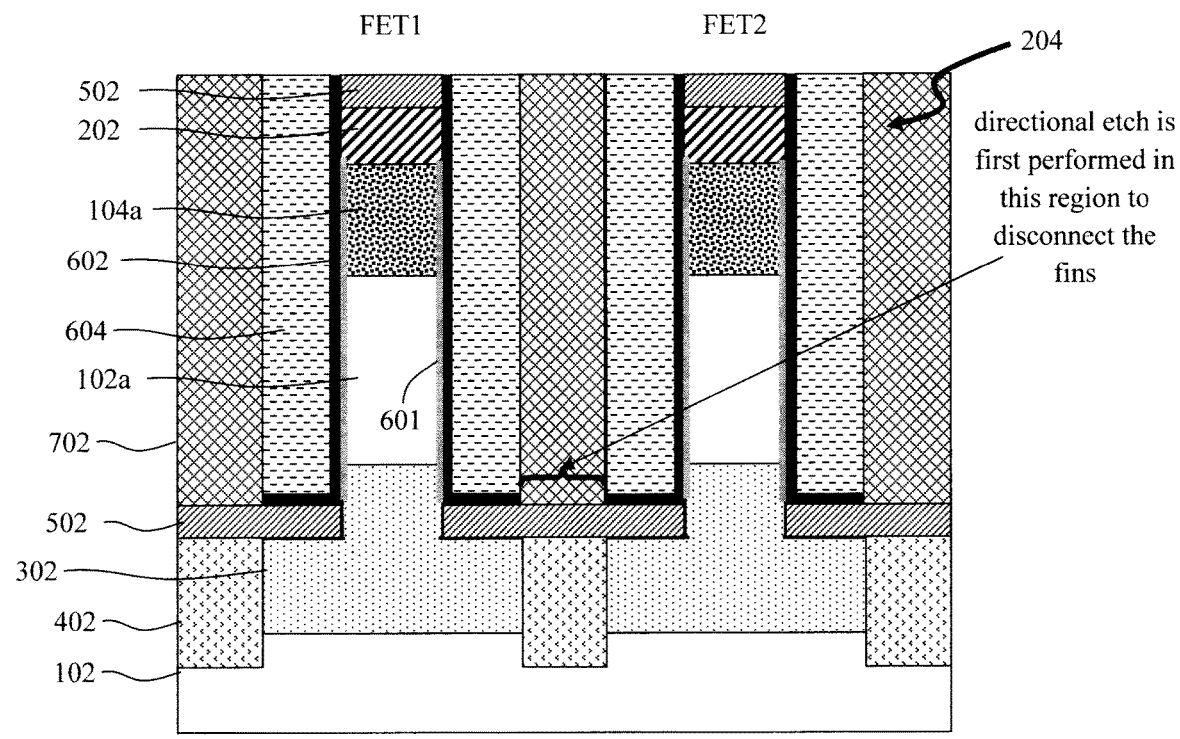
FIG. 7 is a diagram illustrating a dielectric such as an organic planarizing layer (OPL) having been deposited onto the gate conductor filling in the spaces between the fins according to an embodiment of the present invention.
Figure 8:
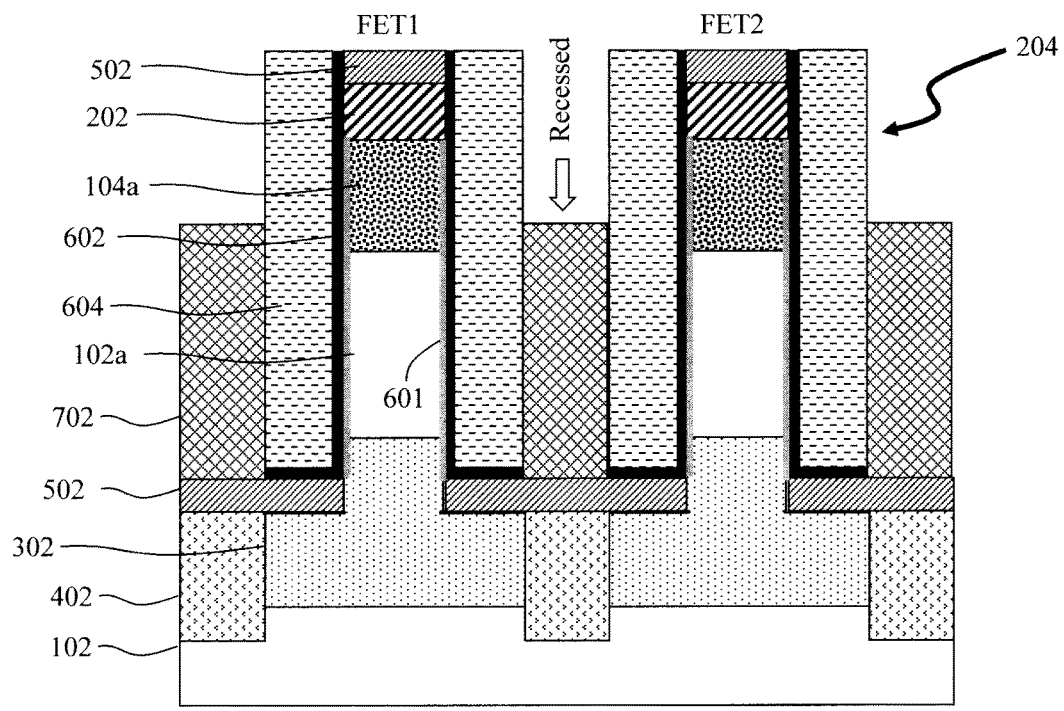
FIG. 8 is a diagram illustrating the OPL having been recessed to below the tops of the fins according to an embodiment of the present invention.

In step 2706, STI regions 2722 are then formed in between the fins 2720. As provided above, the STI regions 2722 isolate the FET devices from one another. At this stage, the structure shown in step 2706 is equivalent to the structure shown in FIG. 4—described above. Thus, this alternative methodology 2700 may be performed prior to forming the bottom spacer 502 as shown in FIG. 5, with the balance of the process being the same as that described in conjunction with the description of FIGS. 5-19, above.

Figure 28:
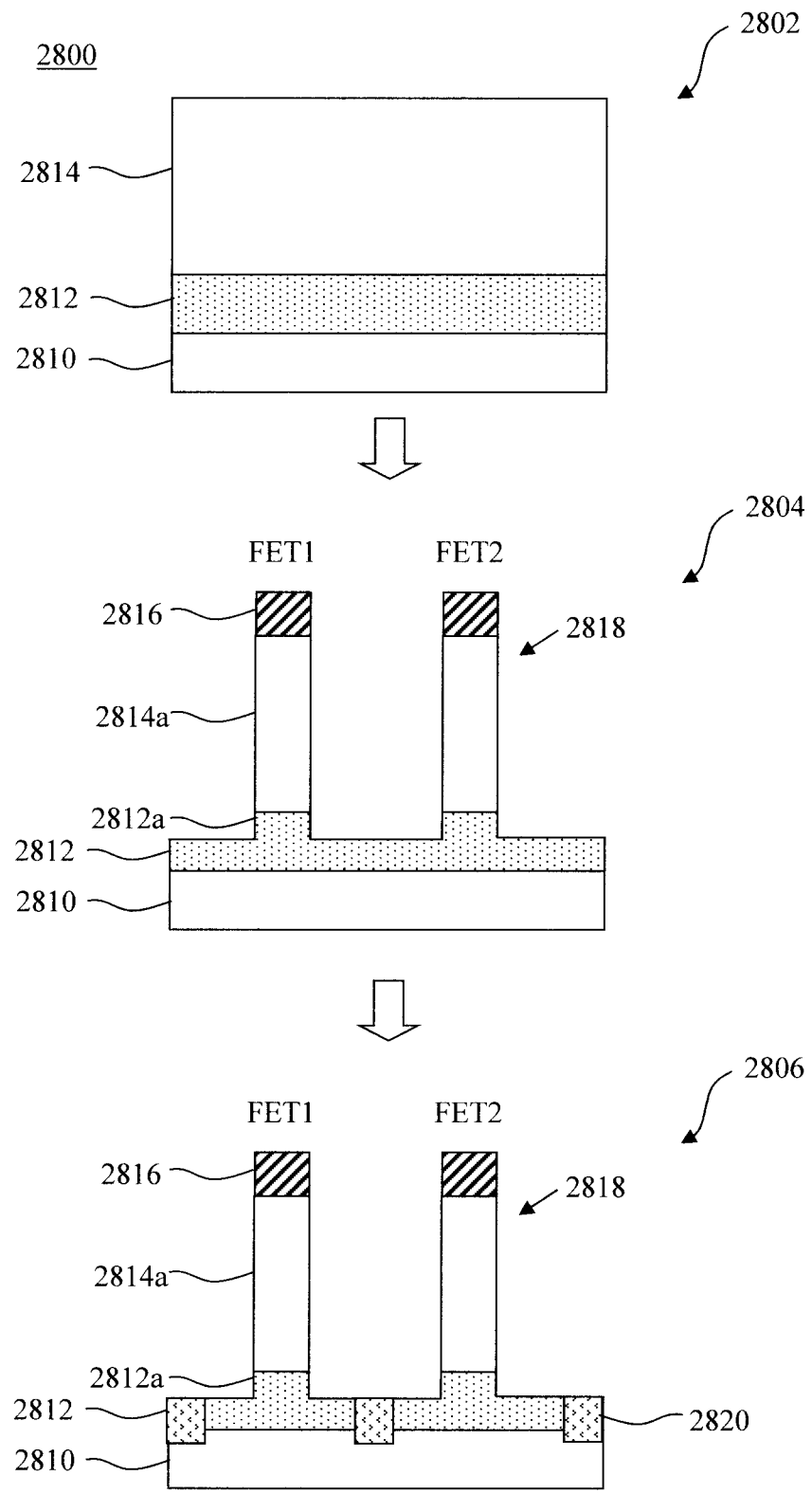
FIG. 28 is a diagram illustrating, according to another alternative embodiment, an exemplary methodology for forming bottom source and drain epitaxy on the starting substrate according to an embodiment of the present invention.

Referring next to methodology 2800 of FIG. 28, in step 2802 a doped epitaxial layer 2812 is formed on a substrate 2810, and an undoped epitaxial layer 2814 is formed on the doped epitaxial layer 2812. Suitable (bulk and SOI) substrate 2810 configurations were provided above. In-situ or ex-situ doping can be used to dope epitaxial layer 2812. By way of example only, epitaxial layer 2812 can be formed from doped epitaxial SiGe and undoped epitaxial layer 2814 can be formed from epitaxial Si, or vice versa.

In the same manner as described above, fin hardmasks 2816 are formed on top of the stack (i.e., substrate 2810/doped epitaxial layer 2812/undoped epitaxial layer 2814) and used to pattern fins 2818 in the stack corresponding to at least one FET1 and at least one FET2. See step 2804. As shown in step 2804, the fins 2818 extend completely through the undoped epitaxial layer 2814, and partway through the doped epitaxial layer 2812. As such, each fin 2818 includes a portion 2812a (formed from doped epitaxial layer 2812—which will serve as the bottom source and drain), and a portion 2814a (formed from the undoped epitaxial layer 2814—which will serve as the vertical fin channel).

In step 2806, STI regions 2820 are then formed in between the fins 2818. As provided above, the STI regions 2820 isolate the FET devices from one another. At this stage, the structure shown in step 2806 is equivalent to the structure shown in FIG. 21 (described above) onto which the bottom spacer 2106, the gate (i.e., gate dielectric 2108 and gate conductor 2110), the conformal encapsulation layer 2112, and the ILD 2116 are formed. Thus, this alternative methodology 2800 may be performed prior to forming the bottom spacer 2106, the gate (i.e., gate dielectric 2108 and gate conductor 2110), the conformal encapsulation layer 2112, and the ILD 2116 as shown in FIG. 21, with the balance of the process being the same as that described in conjunction with the description of FIGS. 21-26, above.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A method for forming a vertical field-effect-transistor (VFET) device, comprising the steps of:
   depositing a doped epitaxial layer onto a substrate;
   patterning fins in the doped epitaxial layer and the substrate using fin hardmasks, wherein at least one of the fins comprises a vertical fin channel of a first FET device (FET1) and at least another one of the fins comprises a vertical fin channel of a second FET device (FET2);
   forming a bottom source and drain in the substrate beneath the fins;
   forming bottom spacers on the bottom source and drain;
   forming gates surrounding the vertical fin channel of the FET1 and the vertical fin channel of the FET2;
   forming top spacers on the gates; and
   forming top source and drains at the tops of the fins, wherein the step of forming the top source and drains comprises varying a positioning of the top source and drains relative to at least one of the vertical fin channel of the FET1 and the vertical fin channel of the FET2 such that the FET1 has an effective gate length Lgate1 and the FET2 has an effective gate length Lgate2, and wherein Lgate1>Lgate2,
   wherein the method further comprises the steps of:
   depositing an interlayer dielectric (ILD) over the fins;
   removing the fin hardmasks to form trenches in the ILD over the fins;
   forming sacrificial spacers along sidewalls of the trenches that cover side portions of the vertical fin channel of the FET1 and the vertical fin channel of the FET2;
   recessing at least one of the vertical fin channel of the FET1 and the vertical fin channel of the FET2 between the sacrificial spacers such that a sliver of vertical fin channel material remains after the recessing; and
   removing the sacrificial spacers.

2. The method of claim 1, wherein the substrate is undoped.

3. The method of claim 1, wherein the gates surrounding the vertical fin channel of the FET1 and the vertical fin channel of the FET2 all have a same physical gate length.

4. The method of claim 1, wherein the step of forming the gates comprises the steps of:
   depositing a gate dielectric onto the fins; and
   depositing a gate conductor onto the gate dielectric.

5. The method of claim 4, wherein the gate dielectric comprises a high-κ material selected from the group consisting of: hafnium oxide ($HfO_2$), lanthanum oxide ($La_2O_3$), and combinations thereof.

6. The method of claim 4, wherein the gate conductor comprises a metal selected from the group consisting of: titanium nitride (TiN), tantalum nitride (TaN), aluminum (Al)-containing alloys, titanium aluminide (TiAl), titanium aluminum nitride (TiAlN), titanium aluminum carbide (TiAlC), tantalum aluminide (TaAl), tantalum aluminum nitride (TaAlN), tantalum aluminum carbide (TaAlC), tungsten (W), and combinations thereof.

7. The method of claim 1, wherein the recessing step further comprises the steps of:
   forming a first block mask covering the FET1;
   recessing the vertical fin channel of the FET2 between the sacrificial spacers to a first depth D1;
   removing the first block mask;
   forming a second block mask covering the FET2;
   recessing the vertical fin channel of the FET1 between the sacrificial spacers to a second depth D2, wherein D2<D1; and
   removing the second block mask.

8. The method of claim 7, further comprising the step of:
   forming the top source and drains i) over the vertical fin channel of the FET1 that has been recessed to depth D2 and ii) over the vertical fin channel of the FET2 which has been recessed to depth D1 such that the positioning of the top source and drains is different in FET1 and FET2.

9. The method of claim 1, wherein the recessing step further comprises the steps of:
- forming a block mask covering the FET1;
- recessing the vertical fin channel of the FET2 between the sacrificial spacers; and
- removing the block mask.

10. The method of claim 1, wherein the fins extend completely through the doped epitaxial layer and partway through the substrate forming a doped epitaxial portion of the doped epitaxial layer on both the vertical fin channel of the FET1 and the vertical fin channel of the FET2.

11. The method of claim 10, further comprising the steps of:
- forming a block mask covering the FET1;
- selectively recessing the doped epitaxial portion and the vertical fin channel of the FET2 between the sacrificial spacers such that a sliver of vertical fin channel material remains in the FET2 after the recessing; and
- removing the block mask.

12. The method of claim 11, further comprising the steps of:
- removing the sacrificial spacers; and
- forming the top source and drains i) over the doped epitaxial portion in the FET1 and ii) over the doped epitaxial portion and the vertical fin channel of the FET2 which have been recessed such that the positioning of the top source and drains is different in FET1 and FET2.

13. The method of claim 1, wherein the doped epitaxial layer comprises a material selected from the group consisting of: epitaxial silicon, epitaxial germanium, epitaxial silicon germanium, and combinations thereof.

14. The method of claim 1, wherein the doped epitaxial layer is doped with an n-type dopant selected from the group consisting of: phosphorous, arsenic, and combinations thereof.

15. The method of claim 1, wherein the doped epitaxial layer is doped with a p-type dopant comprising boron.

16. The method of claim 1, wherein the bottom spacers and the top spacers each comprises a material selected from the group consisting of: silicon dioxide ($SiO_2$), silicon oxycarbide (SiOC), silicon nitride (SiN), silicon-boron-nitride (SiBN), and combinations thereof.

17. A method for forming a VFET device, comprising the steps of:
- depositing a doped epitaxial layer onto a substrate;
- patterning fins in the doped epitaxial layer and the substrate using fin hardmasks, wherein at least one of the fins comprises a vertical fin channel of a first FET device (FET1) and at least another one of the fins comprises a vertical fin channel of a second FET device (FET2), and wherein the fins extend completely through the doped epitaxial layer and partway through the substrate forming a doped epitaxial portion of the doped epitaxial layer on both the vertical fin channel of the FET1 and the vertical fin channel of the FET2;
- forming a bottom source and drain in the substrate beneath the fins;
- forming bottom spacers on the bottom source and drain;
- forming gates surrounding the vertical fin channel of the FET1 and the vertical fin channel of the FET2;
- forming top spacers on the gates; and
- forming top source and drains at the tops of the fins, wherein the step of forming the top source and drains comprises varying a positioning of the top source and drains relative to at least one of the vertical fin channel of the FET1 and the vertical fin channel of the FET2 such that the FET1 has an effective gate length Lgate1 and the FET2 has an effective gate length Lgate2, and wherein Lgate1>Lgate2, wherein the method further comprises the steps of:
- depositing an ILD over the fins;
- removing the fin hardmasks to form trenches in the ILD over the fins;
- forming sacrificial spacers along sidewalls of the trenches that cover side portions of the vertical fin channel of the FET1 and the vertical fin channel of the FET2;
- forming a block mask covering the FET1;
- selectively recessing the doped epitaxial portion and the vertical fin channel of the FET2 between the sacrificial spacers such that a sliver of vertical fin channel material remains in the FET2 after the recessing; and
- removing the block mask.

18. The method of claim 17, further comprising the steps of:
- removing the sacrificial spacers; and
- forming the top source and drains i) over the doped epitaxial portion in the FET1 and ii) over the doped epitaxial portion and the vertical fin channel of the FET2 which have been recessed such that the positioning of the top source and drains is different in FET1 and FET2.

* * * * *